United States Patent [19]

Kimura et al.

[11] Patent Number: 5,436,195

[45] Date of Patent: Jul. 25, 1995

[54] METHOD OF FABRICATING AN INTEGRATED SEMICONDUCTOR LIGHT MODULATOR AND LASER

[75] Inventors: Tadashi Kimura; Yutaka Mihashi; Katuhiko Goto; Takushi Itagaki, all of Itami, Japan

[73] Assignee: Mitsubishi Denki Kabushiki Kaisha, Tokyo, Japan

[21] Appl. No.: 292,203

[22] Filed: Aug. 18, 1994

[30] Foreign Application Priority Data

Aug. 20, 1993 [JP] Japan .................................. 5-206035
Dec. 20, 1993 [JP] Japan .................................. 5-319364

[51] Int. Cl.⁶ ............................................. H01L 21/20
[52] U.S. Cl. ...................................... 437/129; 148/95
[58] Field of Search ................ 437/129; 148/DIG. 95

[56] References Cited

U.S. PATENT DOCUMENTS 4,820,655  4/1989  Noda et al. ......................... 437/129
5,334,551  8/1994  Komatsu ............................. 437/129

FOREIGN PATENT DOCUMENTS 0472221  8/1991  European Pat. Off. .
6467991  3/1989  Japan .
461186   2/1992  Japan .
582909   4/1993  Japan .

OTHER PUBLICATIONS

Aoki et al, "High–Speed (10 Gbit/s) And Low–Drive–Voltage (1 V Peak To Peak) InGaAs/InGaAsP MQW Electroabsorption–Modulator Integrated DFB Laser With Semi–Insulating Buried Heterostructure", Electronics Letters, vol. 28, No. 12, Jun. 1992, pp. 1157–1158.

Primary Examiner—R. Bruce Breneman
Assistant Examiner—Linda J. Fleck
Attorney, Agent, or Firm—Leydig, Voit & Mayer

[57] ABSTRACT

In a method of fabricating an integrated semiconductor light modulator and laser device, a semiconductor layer having first and second regions of different crystal compositions is produced on each chip region of a semiconductor wafer by a selective crystal growth using, as a mask, a dielectric film having a prescribed pattern. Thereafter, a semiconductor laser and a light modulator that modulates laser light emitted from the semiconductor layer are produced in a first semiconductor region and a second semiconductor region, respectively, of each chip region. In this method, the shape of the dielectric mask pattern and the shape of the opening of the mask pattern on each chip region is symmetrical with the dielectric mask pattern and opening of an adjacent chip region along the optical waveguide direction of the semiconductor laser. The semiconductor layer is grown on the wafer so that the first and second semiconductor regions of different crystal compositions on each chip region are in contact with semiconductor regions having the same crystal composition of an adjacent chip region. As the result, at opposite edges of the chip region in the optical waveguide direction, the crystal compositions of the first and second semiconductor regions are the same.

12 Claims, 18 Drawing Sheets

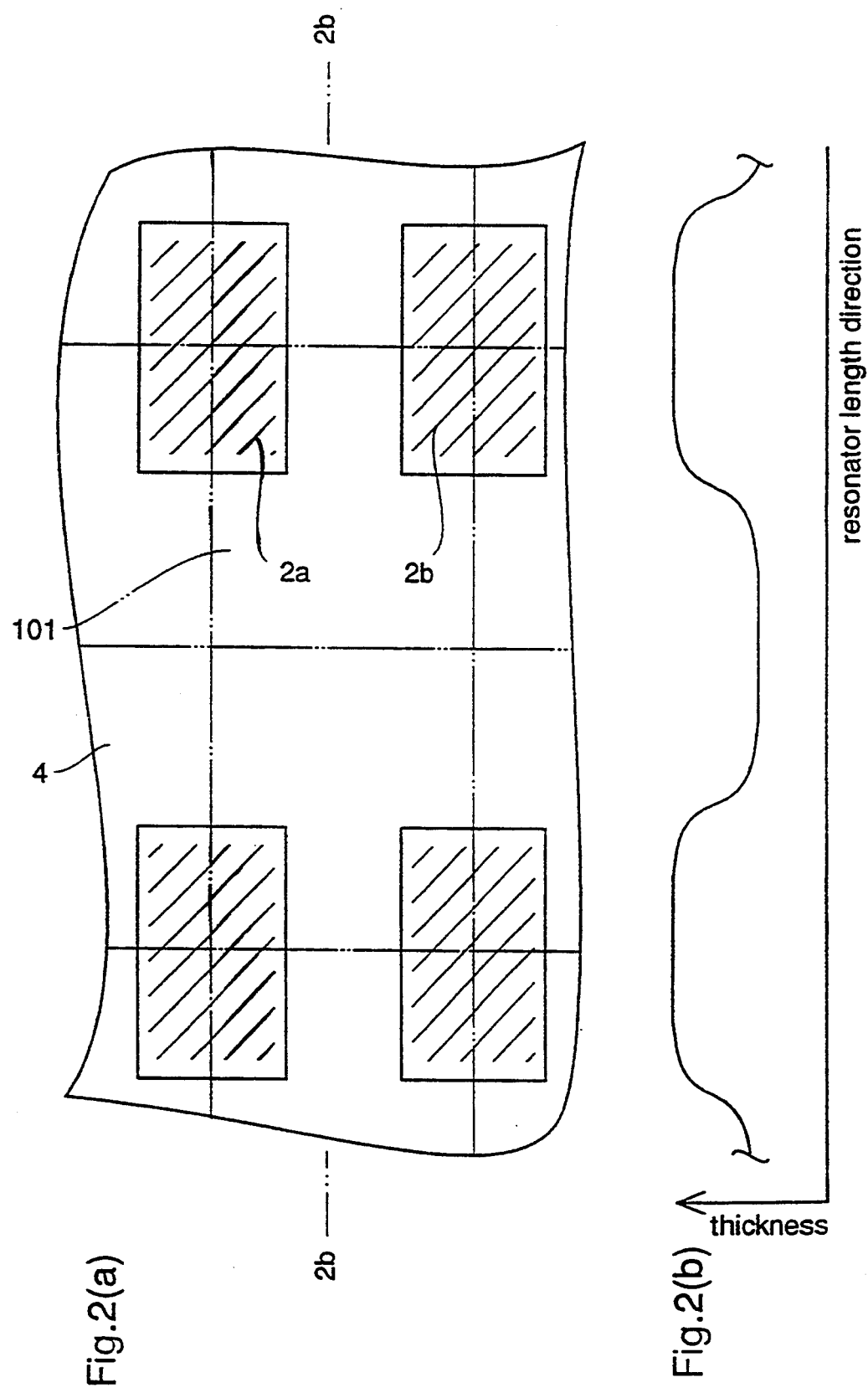

METHOD OF FABRICATING AN INTEGRATED SEMICONDUCTOR LIGHT MODULATOR AND LASER

FIELD OF THE INVENTION

The present invention relates to a method of fabricating an integrated semiconductor light modulator and laser for high-speed and mass-storage optical communication. More particularly, the invention relates to a process of selectively growing a semiconductor layer on a semiconductor wafer so that the grown semiconductor layer on each chip region of the wafer has portions of different compositions for the semiconductor laser and the modulator.

BACKGROUND OF THE INVENTION

FIGS. 11(a)-11(k) are perspective views illustrating process steps in a method of fabricating an integrated semiconductor light modulator and laser according to the prior art.

Initially, as illustrated in FIG. 11(a), a pair of dielectric films 2a and 2b comprising $SiO_2$ or the like are formed on prescribed regions of an n type InP substrate 1 with an unmasked region 1a of the substrate i between them. That is, the surface of the n type InP substrate i is divided into regions in the longitudinal direction, and the dielectric films 2a and 2b are formed on two regions where a semiconductor laser is to be fabricated (hereinafter referred to as laser region A). A laser oscillating part of the semiconductor laser will be produced on the unmasked region 1a between the dielectric films 2a and 2b.

FIG. 10(a) is a plan view illustrating a semiconductor wafer 100 including a plurality of chip regions each corresponding to the semiconductor chip 201 shown in FIG. 11(a). FIG. 10(b) is an enlarged view of a part of the wafer 100. As shown in FIGS. 10(a) and 10(b), the dielectric films 2a and 2b are formed on the wafer 100 so that the respective chip regions 201 have the dielectric films 2a and 2b in the same position.

In the step of FIG. 11(b), using the dielectric films 2a and 2b as masks, the surface of the n type InP substrate 1 is etched to a depth of 1.0~1.5 μm.

In the step of FIG. 11(c), using the dielectric films 2a and 2b as masks, an active layer 4 is selectively grown on the surface 1c of the n type InP substrate 1 exposed in the above-described etching process. More specifically, the active layer 4 comprises an n type InP cladding layer about 0.3~0.5 μm thick, an undoped-InGaAsP/InGaAs MQW (multiquantum well) layer about 0.1 μm thick, and a p type InP cladding layer about 0.3~0.5 μm thick. These layers are successively grown by MOCVD (Metal Organic Chemical Vapor Deposition). The undoped InGaAsP/InGaAs MQW layer serves as a light absorption layer in a light modulator and as an optical waveguide layer in a region between the semiconductor laser and the light modulator.

After removal of the dielectric films 2a and 2b, a photoresist film is deposited on a portion of the active layer 4 grown on the region 1a of the n type InP substrate 1 and on the surface of the n type InP substrate 1 exposed by the removal of the dielectric films 2a and 2b. Using the photoresist film as a mask, a diffraction grating 5 is produced in the laser region A by photolithography and etching techniques as shown in FIG. 11(d). Preferably, an interference exposure technique is employed for the photolithography. The diffraction grating 5 is produced to make a distributed feedback (DFB) semiconductor laser.

Thereafter, as shown in FIG. 11(e), a p type InP layer 6 is grown over the entire surface of the substrate 1 by MOCVD so that the diffraction grating 5 is completely embedded in the InP layer 6.

In the step of FIG. 11(f), the p type InP layer 6, the active layer 4, and the n type InP substrate 1 are selectively etched with HBr etchant to form a stripe-shaped mesa 7 having a height of about 4 μm and a width of 2~3 μm.

In the step of FIG. 11(g), an Fe-doped high resistivity InP layer 8 about 3 μm thick and an n type InP hole trap layer 9 about 1 μm thick are successively grown on the substrate 1, contacting the opposite sides of the stripe-shaped mesa 7. Preferably, these layers are grown by MOCVD.

In the step of FIG. 11(h), a p type InGaAsP contact layer 10 about 0.2 μm thick is grown on the mesa 7 and on the InP hole trap layer 9, preferably by MOCVD.

Thereafter, as shown in FIG. 11(i), the p type InGaAsP contact layer 10 is selectively etched away, leaving a portion 10a in the laser region A and a portion 10b on the p type InP layer 6 in a region where a light modulator is to be produced (hereinafter referred to as modulator region B).

In the step of FIG. 11(j), a surface protection film 11 comprising $SiO_2$ or the like is selectively formed on the n type InP hole trap layer 9 exposed by the selective removal of the contact layer 10 and on the peripheral portions of the remaining contact layers 10a and 10b. Preferably, this surface protection film 11 is formed by thermal CVD.

Thereafter, a p side electrode 12 for the light modulator and a p side electrode for the semiconductor laser are formed in contact with the p type InGaAsP contact layers 10b and 10a, respectively. Preferably, these p side electrodes 12 and 13 comprise Ti/Pt/Au. Further, an n side electrode 14 comprising, for example, AuSn/Au, is formed on the rear surface of the n type InP substrate 1. Further, an anti-reflection coating (not shown) is formed on a facet of the light modulator from which laser light is emitted. Thus, an integrated semiconductor light modulator and laser 200 in which a semiconductor laser 200a and a light modulator 200b are integrated on the same substrate 1 is completed (FIG. 11(k)).

Generally, when a III-V compound semiconductor layer is grown on a substrate with a dielectric mask pattern by MOCVD, the composition of the grown semiconductor layer varies due to the phenomenon described in the following, whereby the photoluminescence (PL) peak wavelength, i.e., the band gap energy, of the semiconductor layer varies. That is, an organometallic compound that contains group-III atoms, such as TEG (triethylgallium) or TMI (trimethylindium), is applied to the surface of the semiconductor substrate and thermally decomposed at the surface of the substrate, producing group-III atoms. These group-III atoms are taken in appropriate positions of the crystal lattice of the semiconductor substrate. Meanwhile, group-V atoms are produced by thermal decomposition of $AsH_3$ (arsine) gas or $PH_3$ (phosphine) gas. These group-III atoms and group-V atoms combine with each other at the lattice positions, whereby a crystal layer is grown. On the other hand, the group-III atom containing organometallic compound applied to the dielectric mask is not thermally decomposed but moves on the surface of the dielectric mask. This phenomenon is called "migration". As the result of the migration, the organometallic compound is taken in the crystal layer growing on the semiconductor substrate in the vicinity of the dielectric mask, and the group-III atoms included in the organometallic compound are combined with the group-V atoms as described above. Therefore, the crystal layer grown on a region of the substrate in the vicinity of the dielectric mask has a group-III element composition ratio larger than that of the crystal layer grown on other regions. Therefore, the PL peak wavelength, i.e., the band gap energy, of the semiconductor layer grown on the region in the vicinity of the dielectric film shifts toward the longer wavelength side, i.e., the smaller energy side, compared to that of the semiconductor layer grown on the region far from the dielectric mask. Further, the growth rate of the semiconductor layer increases in the region near the dielectric mask because of the above-described migration of the group-III atoms and, therefore, the grown semiconductor layer is thicker in the region near the dielectric mask than in other regions. For example, when an MQW layer is grown on the semiconductor substrate with the dielectric mask, the thickness of the well layer included in the MQW layer varies, whereby the PL peak wavelength of the MQW layer grown on the region in the vicinity of the dielectric mask shifts toward the long wavelength side. In this way, when a semiconductor layer is grown on the semiconductor substrate partially masked with the dielectric film, the PL peak wavelength of the semiconductor layer grown on the semiconductor substrate is varied.

According to the above-described principle, in the fabrication process of the integrated semiconductor light modulator and laser chip 200, the group-III element composition ratio and the thickness of the active layer 4 including the MQW layer is larger in the region 1a of the substrate 1 sandwiched between the dielectric masks 2a and 2b than in the modulator region B where the dielectric mask is absent because a lot of group-III atoms migrate from the dielectric masks 2a and 2b to that region 1a. Therefore, the PL peak wavelength of the active layer 4 in the laser oscillation region 1a of the laser region A shifts toward the longer wavelength side from the PL peak wavelength of the active layer 4 in the modulator region B.

Furthermore, when the width of the unmasked region 1a between the dielectric masks 2a and 2b is varied by varying the widths of the dielectric masks 2a and 2b, the quantity of the group-III atoms migrating from the dielectric masks 2a and 2b into the growing semiconductor layer on the region 1a changes, whereby the composition, i.e., the PL peak wavelength, of the grown semiconductor layer changes. As the width of the region 1a is reduced by increasing the widths of the dielectric masks 2a and 2b, the PL peak wavelength shifts toward the longer wavelength side. On the other hand, as the width of the region 1a is increased by decreasing the widths of the dielectric masks 2a and 2b, the PL peak wavelength shifts toward the shorter wavelength side.

In this way, in the integrated semiconductor light modulator and laser chip 200, the PL peak wavelength of the MQW light absorption layer of the light modulator 200b is smaller than the PL peak wavelength of the MQW active layer of the semiconductor laser 200a. Therefore, when a forward producing a current exceeding a threshold current is applied to the semiconductor laser 200a, laser light emitted from the semiconductor laser 200a travels through the MQW optical waveguide layer interposed between the active layer of the semiconductor laser 200a and the light absorption layer of the modulator 200b and through the light absorption layer of the modulator 200b and is output from the facet of the modulator 200b. During the oscillation of the semiconductor laser 200a, when a reverse bias is applied to the light modulator 200b, the absorption end of the light absorption layer shifts toward the long wavelength side, and the light absorption layer absorbs the laser light. Because of this principle, the light modulator 200b is called an electroabsorption modulator. Therefore, when the bias voltage applied to the light modulator 200b is controlled while causing oscillating the semiconductor laser 200a, the intensity of the laser light emitted from the facet of the modulator 200b is modulated, i.e., on and off switching of the laser light is performed. In this way, the light modulator 200b is used as a light source for optical communication.

In the above-described fabrication method, since the semiconductor laser 200a and the light modulator 200b are simultaneously produced on the same semiconductor substrate 1, the fabrication process is simplified. In addition, since the semiconductor layers included in the semiconductor laser 200a are crystallographically continuous with the semiconductor layers included in the light modulator 200b, the transmission loss of the laser light traveling through the region between the laser 200a and the modulator 200b is reduced. However, in order to obtain optical signals with higher stability, a lot of problems remain to be solved. These problems will be described in detail hereinafter.

FIG. 12(a) is a plan view illustrating a chip region 201 with a pair of dielectric masks 2a and 2b, corresponding to the step shown in FIG. 11(a). FIG. 12(b) is a graph illustrating variations in the crystal composition of an InGaAsP/InGaAs MQW layer selectively grown on the chip region 201 with the dielectric masks 2a and 2b. The variations in the crystal composition are shown by PL peak wavelengths of the MQW layer measured along the optical waveguide direction of the MQW layer. In FIG. 12(a), reference numeral 1a designates a region of the MQW layer between the dielectric masks 2a and 2b where a semiconductor laser is to be fabricated (hereinafter referred to as laser region), and numeral 1b designates a region of the MQW layer where a light modulator is to be fabricated (hereinafter referred to as modulator region). In FIG. 12(b), the ordinate shows PL peak wavelengths of the MQW layer, and the abscissa shows positions on the chip region along what becomes the resonator length direction of the semiconductor laser. As shown in FIG. 12(b), the crystal composition of the MQW layer grown on the laser region 1a between the dielectric masks 2a and 2b is not stable in the vicinity of the boundary between the laser region 1a and the modulator region 1b. The crystal composition becomes stable at a distance from the boundary, and the PL peak wavelength at this portion is the emission wavelength of the semiconductor laser.

Further, the crystal composition of the MQW layer grown on the modulator region 1b where no dielectric mask is present is not stable in the vicinity of the boundary between the laser region 1a and the modulator region 1b. The crystal composition becomes stable at a distance from the boundary, and the PL peak wavelength at this portion is the absorption wavelength of the light modulator. Hereinafter, a portion of the MQW layer at the boundary between the laser region 1a and the modulator region 1b is called a transition region where the crystal composition, i.e., the PL peak wavelength, of the MQW layer gradually changes.

The performance of the device is affected by the length (L) of the transition region. FIG. 13 is a graph illustrating variations in the crystal composition of a modulator integrated semiconductor laser device which is produced so that the absorption wavelength $\lambda_{MOD}$ of the light modulator is 1.50 μm and the emission wavelength $\lambda_{LD}$ of the semiconductor laser is 1.55 μm. The variations in the crystal composition of the laser device are shown by PL peak wavelengths measured along the optical waveguide direction. In FIG. 13, it is assumed that the transition region between the semiconductor laser and the light modulator has a crystal composition corresponding to a wavelength $\lambda_{trans.}$ of 1.525 μm. It is well known that a crystal layer having a crystal composition corresponding to a wavelength of 1.525 μm serves as an absorber for light having a wavelength of 1.55 μm, and the absorption coefficient α is about 780 cm$^{-1}$. In the transition region shown in FIG. 13, if it is assumed that the coefficient of optical confinement of the optical waveguide layer to the cladding layer is 10%, the substantial absorption coefficient α' is 78 cm$^{-1}$. The light intensity I, which is obtained when light having an intensity $I_0$ has passed through an absorber having an absorption coefficient α and a thickness L, is represented by $$I = I_0 \exp(-\alpha L)$$

Therefore, the ratio R of the intensity I of the light that has passed through the absorber to the intensity $I_0$ of the light before passing through the absorber is represented by $$R = I/I_0 = \exp(-\alpha L)$$

Assuming that the length L of the transition region is 200 μm, the light intensity ratio R is calculated as follows:

$$R = I/I_0 = \exp(-78 \times 200 \times 10^{-4})$$
$$= 2.1 \times 10^{-1}$$

Assuming that the length L of the transition region is 50 μm, the light intensity ratio R is calculated as follows:

$$R = I/I_0 = \exp(-78 \times 50 \times 10^{-4})$$
$$= 6.8 \times 10^{-1}$$

That is, when the length L of the transition region decreases to ¼, i.e., from 200 μm to 50 μm, the intensity of laser light traveling from the semiconductor laser to the light modulator increases by three times, i.e., from 21% to 68%. Therefore, as the length L of the transition region decreases, the attenuation in the intensity of the laser light before reaching the light modulator is suppressed, whereby a stable optical signal with a high on/off ratio is obtained.

However, in the prior art method of fabricating a modulator integrated semiconductor laser device described with respect to FIGS. 11(a)-11(k), the width of the dielectric masks 2a and 2b and the width of the opening 1a between the dielectric masks 2a and 2b are predetermined to attain a desired emission wavelength of the semiconductor laser. In this case, however, since the length L of the transition region is unconditionally determined, it is not possible to reduce the length of the transition region.

Recently, an improved method of fabricating a modulator integrated semiconductor laser device in which a region where laser light is substantially absorbed is reduced has been developed.

FIGS. 14(a) and 14(b) are a perspective view and a plan view for explaining the improved method of fabricating a modulator integrated semiconductor laser device. In these figures, a pair of dielectric masks 22a and 22b having an opening 1a are disposed on a region A of the surface of the n type InP substrate 1 where a semiconductor laser is to be fabricated, and a pair of dielectric masks 23a and 23b having an opening 1b are disposed on a region C of the surface of the n type InP substrate where a light modulator is to be produced. Preferably, these dielectric masks 22a, 22b, 23a, and 23b comprise SiO$_2$. The width w$_4$ of the unmasked portion 1b between the dielectric masks 23a and 23b is larger than the width w$_3$ of the unmasked portion 1a between the dielectric masks 22a and 22b.

The fabrication process of this modulator integrated semiconductor laser is basically identical to the process already described with respect to FIGS. 11(a)-11(k) except that the dielectric mask pattern shown in FIG. 14(a) is formed in the step of FIG. 11(a). The emission wavelength of the semiconductor laser is controlled by the width w$_3$ of the unmasked portion 1a between the dielectric masks 22a and 22b, and the absorption wavelength of the light modulator is controlled by the width w$_4$ of the unmasked portion 1b between the dielectric masks 23a and 23b.

In this fabrication process, the length of the laser light absorbing portion in the transition region between the laser region and the modulator region can be reduced. The reason will be described hereinafter.

FIG. 14(c) is a graph illustrating variations in the crystal composition of an InGaAsP/InGaAs MQW layer that is grown on the n type InP substrate 1 with the dielectric mask pattern shown in FIG. 14(b) by MOCVD. The variations in the crystal composition are shown by PL peak wavelengths of the MQW layer measured along the optical waveguide direction. In FIG. 14(c), a curve c shows variations in the crystal composition (PL peak wavelength) of the MQW layer due to the dielectric masks 22a and 22b, and a curve d shows variations in the crystal composition (PL peak wavelength) of the MQW layer due to the dielectric masks 23a and 23b. A broken line shows variations in the crystal composition (PL peak wavelength) of the MQW layer due to the dielectric masks 22a, 22b, 23a, and 23b.

As shown in FIG. 14(c), the length L of the transition region where the PL peak wavelength of the MQW layer is not stable is longer than that of the laser device fabricated by the method shown in FIGS. 11(a)-11(k). However, the length L$_A$ of a part of the transition region, which part has a wavelength longer than the absorption wavelength $\lambda_{MOD}$ of the modulator region and absorbs laser light having the emission wavelength $\lambda_{LD}$ of the semiconductor laser, is about half of that of the laser device fabricated by the method of FIGS. 11(a)-11(k) in which the entire transition region has a wavelength longer than the absorption wavelength $\lambda_{MOD}$ and absorbs the laser light. A part of the entire transition region having a length $L_B$ has a wavelength shorter than the absorption wavelength $\lambda_{MOD}$ of the modulator, so that this part does not absorb the laser light having the laser wavelength $\lambda_{LD}$. Therefore, a pair of dielectric masks 22a and 22b and a pair of dielectric masks 23a and 23b are disposed in the laser region and in the modulator region, respectively, so that the width $w_4$ of the opening 1b between the dielectric masks 23a and 23b is larger than the width $w_3$ of the opening 1a between the dielectric masks 22a and 22b, whereby a portion having a PL peak wavelength shorter than the PL peak wavelength (emission wavelength) of the active layer of the semiconductor laser and the PL peak wavelength (absorption wavelength) of the light absorption layer of the light modulator is produced in the optical waveguide layer connecting the active layer and the light absorption layer. Therefore, the length of the portion of the optical waveguide layer which substantially absorbs laser light produced in the semiconductor laser is significantly reduced compared to the laser device fabricated with the dielectric mask pattern shown in FIG. 12.

FIG. 15(a) is a perspective view illustrating a modification of the dielectric mask pattern shown in FIG. 14(a). In the figure, the same reference numerals as in FIG. 14(a) designate the same or corresponding parts.

In the dielectric mask pattern shown in FIG. 14(a), the width $w_4$ of the opening 1b between the dielectric masks 23a and 23b is larger than the width $w_3$ of the opening 1a between the dielectric films 22a and 22b. However, in the dielectric mask pattern shown in FIG. 15(a), the width $w_4$ is equal to the width $w_3$. In this case, the profile of the crystal composition (PL peak wavelength) as shown in FIG. 14(c) is achieved by appropriately selecting the width of the dielectric film 22a (22b) and the width of the dielectric film 23a (23b). Also in this case, the same effects as described above are achieved.

FIG. 15(b) is a perspective view illustrating another modification of the dielectric mask pattern shown in FIG. 14(a). In the figure, the same reference numerals as in FIG. 14(a) designate the same or corresponding parts. Japanese Published Patent Application No. Hei. 5-82909, discloses a method of producing a semiconductor layer including a laser region and a light modulator region using a mask for selective growth having the same pattern as that shown in FIG. 15(b).

The dielectric mask pattern shown in FIG. 15(b) includes a pair of dielectric masks 24a and 24b on a region D between the laser region A and the modulator region B, in addition to the mask pattern shown in FIG. 15(a). The width of the dielectric mask 24a (24b) is smaller than the width of the dielectric mask 23a (23b). The width $w_5$ of an unmasked portion of the substrate 1 between the dielectric masks 24a and 24b is selected so that the relationship of $w_3 \leq w_5 \leq w_4$ is satisfied.

In this case, by appropriately selecting the width of the dielectric mask 24a (24b) and the width $w_5$ of the opening between the dielectric masks 24a and 24b, the profile of the crystal composition of the optical waveguide layer (transition region) connecting the active layer of the laser and the light absorption layer of the modulator is improved. For example, a steep change of the crystal composition is achieved at the boundary between the active layer and the optical waveguide layer. As the result, the performance of the integrated semiconductor light modulator and laser device is significantly improved.

In the prior art methods of fabricating integrated semiconductor light modulator and laser devices described with respect to FIGS. 14(a)–14(c) and 15(a)–15(b), although the laser light absorbing portion in the transition region is reduced, the length of the transition region itself is increased, resulting in an increase in the chip size of the device.

Furthermore, in the above-described prior art methods of fabricating integrated semiconductor light modulator and lasers, since the dielectric mask pattern is produced on the semiconductor wafer with a pair of dielectric masks disposed in the same position on each chip region, the semiconductor laser section of the chip region 201 is in contact with the light modulator section of an adjacent chip region in the longitudinal direction of the chip region, as shown in FIG. 10(b). Therefore, as shown in FIG. 10(c), the thickness of the optical waveguide region of the semiconductor layer unfavorably varies at the edges of the laser region and the modulator region in contact with the adjacent chip region, resulting in unstable wavelength light by emission the laser and unstable wavelength absorption by the modulator.

SUMMARY OF THE INVENTION

It is an object of the present invention to provide a method of fabricating an integrated semiconductor light modulator and laser device that reduces the length of the transition region, that produces a stable optical signal with a high on/off ratio, and that provides a reduced chip size.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, in a method of fabricating an integrated semiconductor light modulator and laser device, a semiconductor layer having first and second regions of different crystal compositions is produced on each chip region of a semiconductor wafer by selective crystal growth using a dielectric film having a prescribed pattern as a mask. Thereafter, a semiconductor laser and a light modulator that modulates the intensity of laser light emitted from the semiconductor layer are produced in the first semiconductor region and the second semiconductor region, respectively. In this method, the shape of the dielectric mask pattern and the shape of the opening of the mask pattern on each chip region is symmetrical with those on adjacent chip regions in the optical waveguide direction of the semiconductor laser. Therefore, the semiconductor layer is grown on the wafer so that the first and second semiconductor regions of different crystal compositions on each chip region are in contact with the semiconductor region of the same crystal composition on adjacent chip region. Therefore, at opposite edges of the chip region in the optical waveguide direction, the crystal compositions of the first and second semiconductor regions are uniform.

According to a second aspect of the present invention, in a method of fabricating an integrated semiconductor light modulator and laser device, a semiconductor layer having first and second regions of different crystal compositions is produced on each chip region of a semiconductor wafer by selective crystal growth using a dielectric film having a prescribed pattern as a mask. Thereafter, a semiconductor laser and a light modulator that modulates the intensity of laser light emitted from the semiconductor layer are produced in the first semiconductor region and the second semiconductor region, respectively. In this method, the dielectric mask pattern for the selective growth is formed on a part of the chip region where the semiconductor laser is to be produced so that a pair of dielectric masks are opposed to each other on the laser region, and the width of each mask is larger in a portion near the region where the modulator is to be produced than in a portion far from the modulator region. Therefore, when the semiconductor layer is grown on the wafer, since the opening ratio of the dielectric mask pattern is reduced in a part of the laser region in the vicinity of the modulator region, the quantity of the growth elements migrating from the dielectric mask to the substrate exposed in the opening increases. Thereby, reduction in the growth elements is suppressed in that part of the laser region adjacent to the modulator region, so that a steep change of the composition is achieved between the laser region and the modulator region. As the result, the transition region in which the composition changes is significantly reduced.

According to a third aspect of the present invention, in a method of fabricating an integrated semiconductor light modulator and laser device, a semiconductor layer having first and second regions of different crystal compositions is produced on each chip region of a semiconductor wafer by selective crystal growth using a dielectric film having a prescribed pattern as a mask. Thereafter, a semiconductor laser and a light modulator that modulates the intensity of laser light emitted from the semiconductor layer are produced in the first semiconductor region and the second semiconductor region, respectively. In this method, the mask pattern on the chip region comprises a pair of dielectric masks opposed to each other with a prescribed space between them, and the width of the dielectric mask in the laser region gradually increases toward the modulator region, and the width of the dielectric mask in the modulator region gradually decreases toward the laser region and becomes minimum at the boundary between the laser region and the modulator region. Therefore, when the semiconductor layer is grown on the wafer, since the opening ratio of the dielectric mask is reduced at a part of the laser region in the vicinity of the modulator region compared to the other part, the quantity of growth elements migrating from the dielectric mask to that part increases. On the other hand, since the opening ratio of the dielectric mask is increased at a part of the modulator region in the vicinity of the laser region, the quantity of the growth elements migrating from the dielectric mask to that part decreases. Therefore, a reduction in the quantity of the growth elements is suppressed in the part of the laser region near the modulator region and an increase in the quantity of the growth elements is suppressed in the part of the modulator region near the laser region. Therefore, a steep change of crystal composition is achieved at the boundary between the laser region and the modulator region, whereby the transition region between these regions is significantly reduced.

BRIEF DESCRIPTION OF THE DRAWINGS

FIGS. 1(a) and 1(b) are diagrams for explaining a method of fabricating a modulator integrated semiconductor laser device in accordance with a first embodiment of the present invention, wherein FIG. 1(a) is a plan view illustrating a mask pattern for selective growth produced on a wafer and FIG. 1(b) is a perspective view illustrating a chip region in the wafer.

FIGS. 2(a) and 2(b) are diagrams for explaining a semiconductor layer grown on the wafer with the mask pattern according to the first embodiment, wherein FIG. 2(a) is an enlarged view of a part of the wafer shown in FIG. 1(a) and FIG. 2(b) is a graph showing variations in the thickness of the semiconductor layer in a cross section taken along line 2b—2b of FIG. 2(a).

FIGS. 3(a) and 3(b) are diagrams for explaining the semiconductor layer grown on each chip region of the wafer with the mask pattern according to the first embodiment, wherein FIG. 3(a) is a plan view of the chip region and FIG. 3(b) is a graph showing variations in the PL peak wavelength of the semiconductor layer in a section taken along line 3b—3b of FIG. 3(a).

FIGS. 4(a) and 4(b) are diagrams for explaining a method of fabricating an integrated semiconductor light modulator and laser device in accordance with a second embodiment of the present invention, wherein FIG. 4(a) is a plan view illustrating a mask pattern for selective growth produced on a wafer and FIG. 4(b) is a perspective view illustrating a chip region in the wafer.

FIGS. 6(a) and 6(b) are diagrams for explaining a semiconductor layer grown on each chip region of the wafer with the mask pattern according to the second embodiment, wherein FIG. 6(a) is a plan view of the chip region and FIG. 6(b) is a graph showing variations in the PL peak wavelength of the semiconductor layer in a section taken along line 6b—6b of FIG. 6(a).

FIGS. 7(a) and 7(b) are diagrams for explaining a method of fabricating an integrated semiconductor light modulator and laser device in accordance with a third embodiment of the present invention, wherein FIG. 7(a) is a plan view illustrating a mask pattern for selective growth produced on a wafer and FIG. 7(b) is a perspective view illustrating a chip region in the wafer.

FIGS. 8(a) and 8(b) are diagrams for explaining a method of fabricating a modulator integrated semiconductor laser device in accordance with a fourth embodiment of the present invention, wherein FIG. 8(a) is a plan view illustrating a mask pattern for selective growth produced on a wafer and FIG. 8(b) is a perspective view illustrating a chip region in the wafer.

FIGS. 9(a) and 9(b) are diagrams for explaining the semiconductor layer grown on each chip region of the wafer with the mask pattern according to the fourth embodiment, wherein FIG. 9(a) is a plan view of the chip region and FIG. 9(b) is a graph showing variations in the PL peak wavelength of the semiconductor layer in a section taken along line 9b—9b of FIG. 9(a).

FIGS. 10(a)-10(c) are diagrams for explaining a method of fabricating an integrated semiconductor light modulator and laser device according to the prior art, wherein FIG. 10(a) is a plan view illustrating a mask pattern for selective growth produced on a wafer, FIG. 10(b) is an enlarged view of a part of the wafer shown in FIG. 10(a), and FIG. 10(c) is a graph showing variations in the thickness of a semiconductor layer grown on the wafer in a section taken along line 10c—10c of FIG. 10(b).

FIGS. 12(a) and 12(b) are diagrams for explaining a semiconductor layer grown on each chip region of the wafer with the mask pattern according to the prior art, wherein FIG. 12(a) is a plan view of the chip region and FIG. 12(b) is a graph showing variations in the PL peak wavelength of the semiconductor layer in a section taken along line 12b—12b of FIG. 12(a).

FIGS. 14(a)-14(c) are diagrams for explaining an improved mask pattern used in the prior art fabrication method for an integrated semiconductor light modulator and laser, wherein FIG. 14(a) is a perspective view illustrating the mask pattern on a chip region, FIG. 14(b) is a plan view of FIG. 14(a), and FIG. 14(c) is a graph showing PL peak wavelengths of a semiconductor laser grown on the chip region in a section taken along line 14c—14c of FIG. 14(b).

DETAILED DESCRIPTION OF THE PREFERRED EMBODIMENTS

Figure 1:
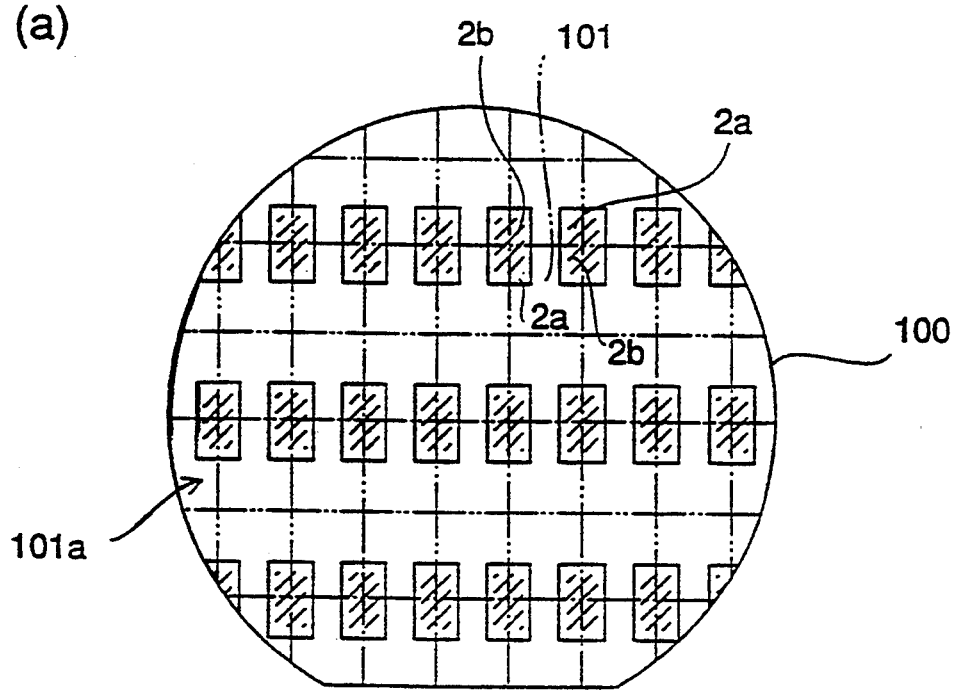
Figure 1:
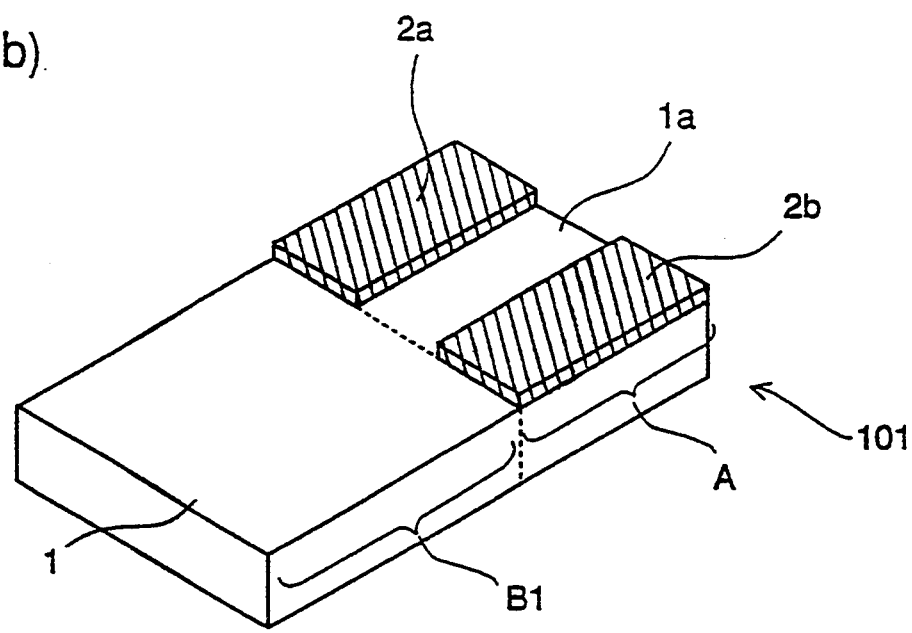
Figure 10A:
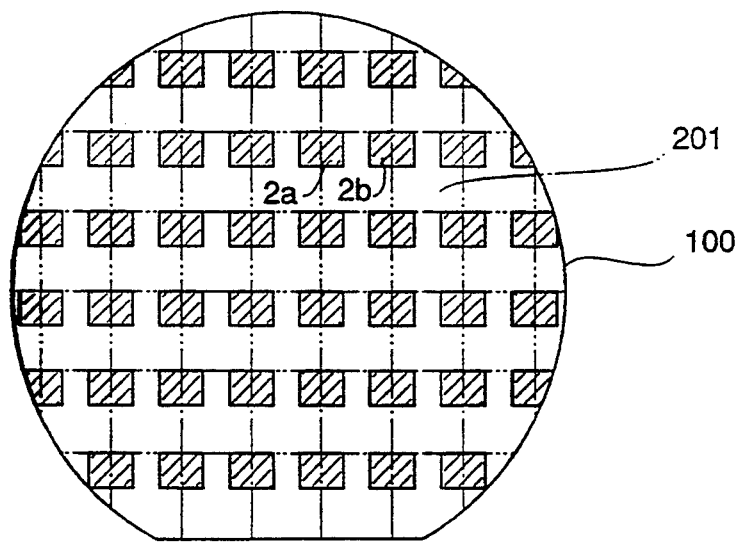
Figure 10B:
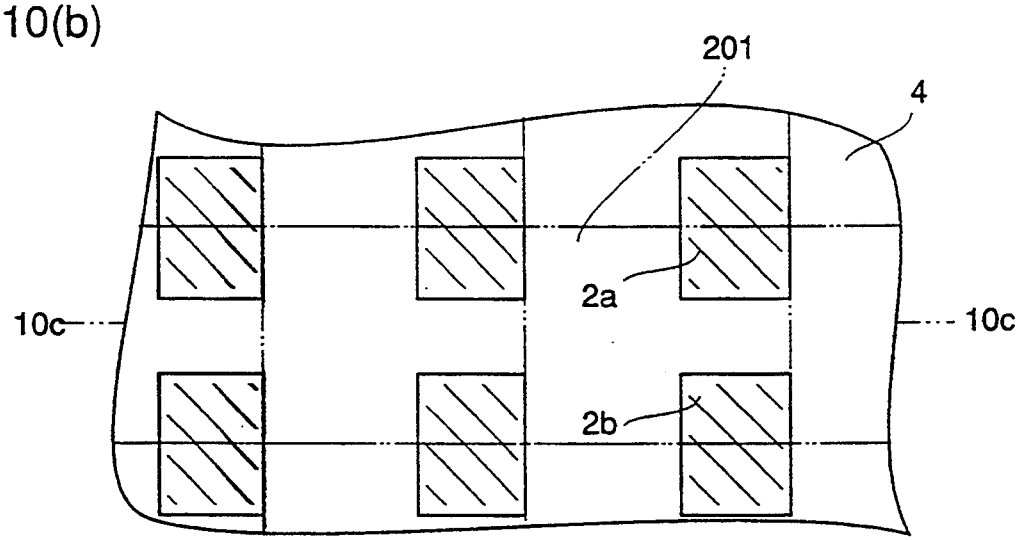
Figure 10C:
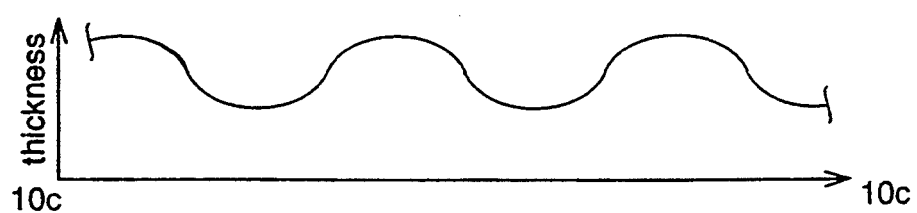
Figure 11A:
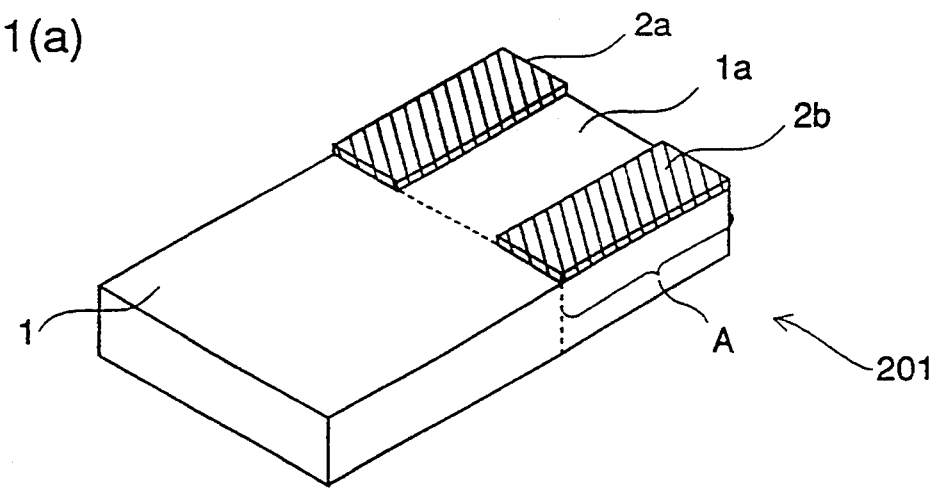
FIGS. 11(a)-11(k) are perspective views illustrating process steps in a method for fabricating a modulator integrated semiconductor laser device in accordance with the prior art.
Figure 11B:
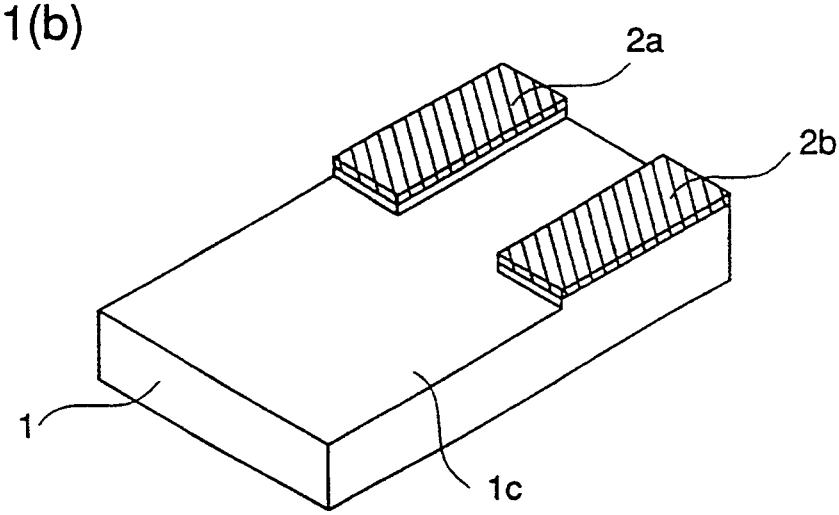
Figure 11C:
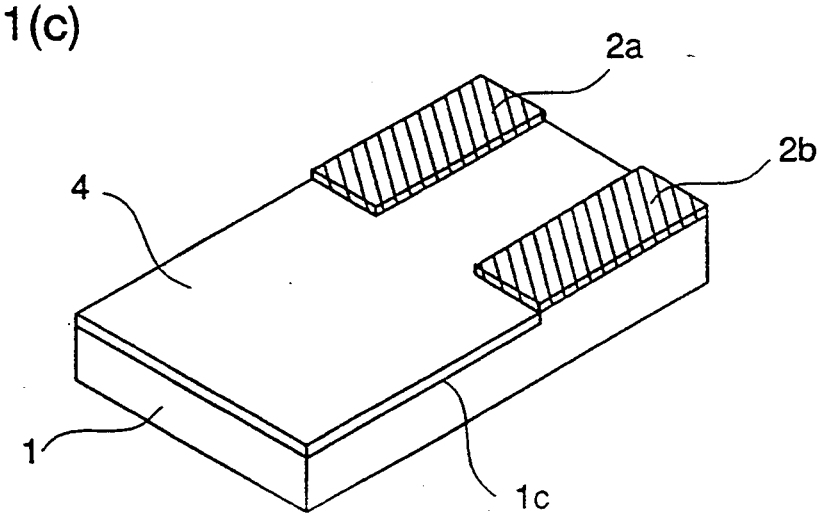
Figure 11D:
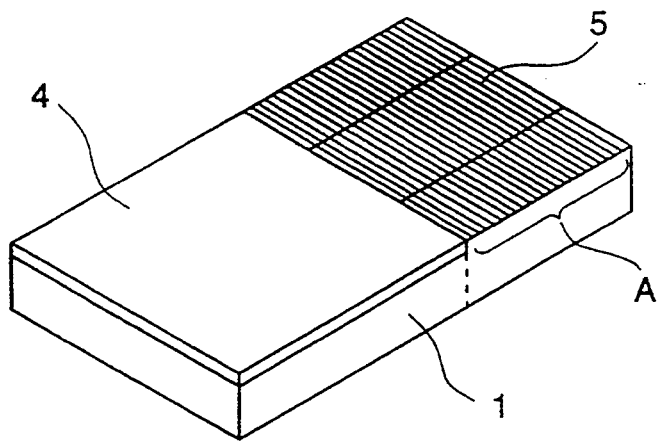
Figure 11E:
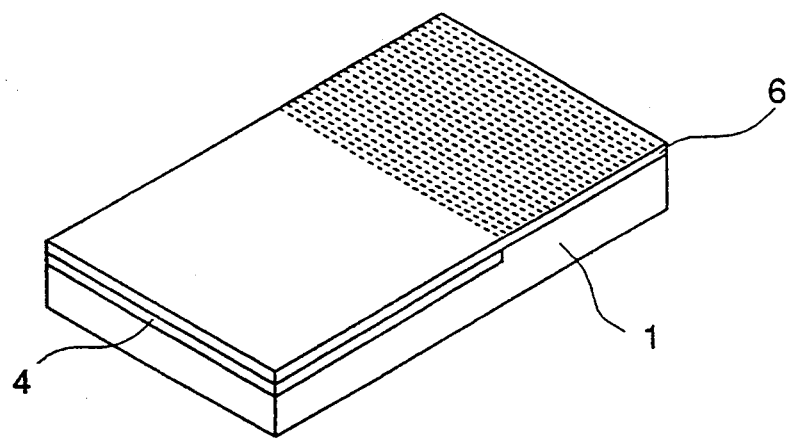
Figure 11F:
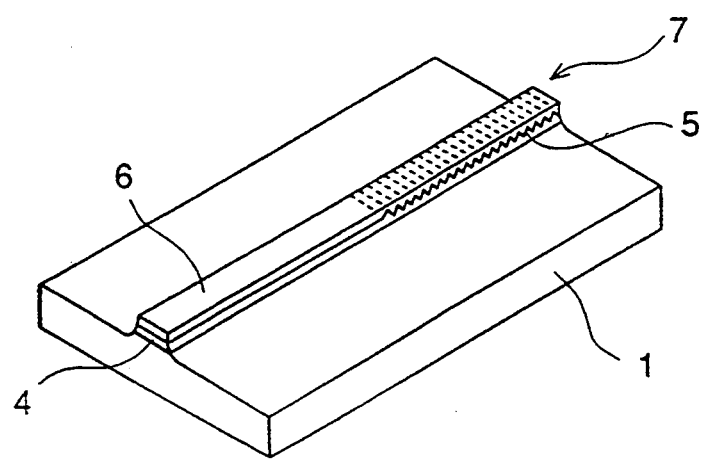
Figure 11G:
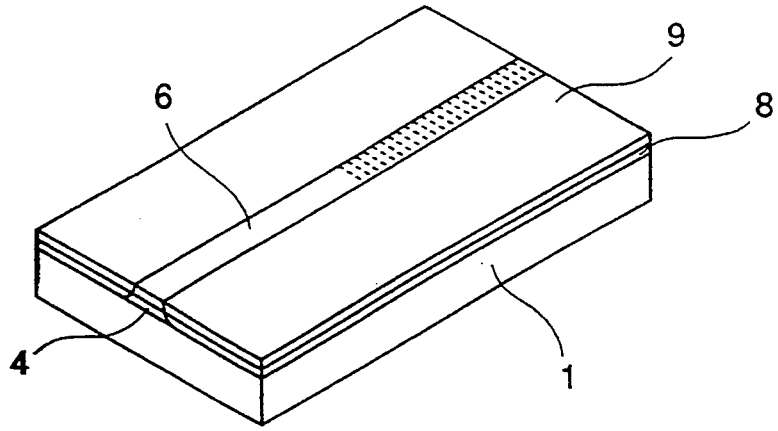
Figure 11H:
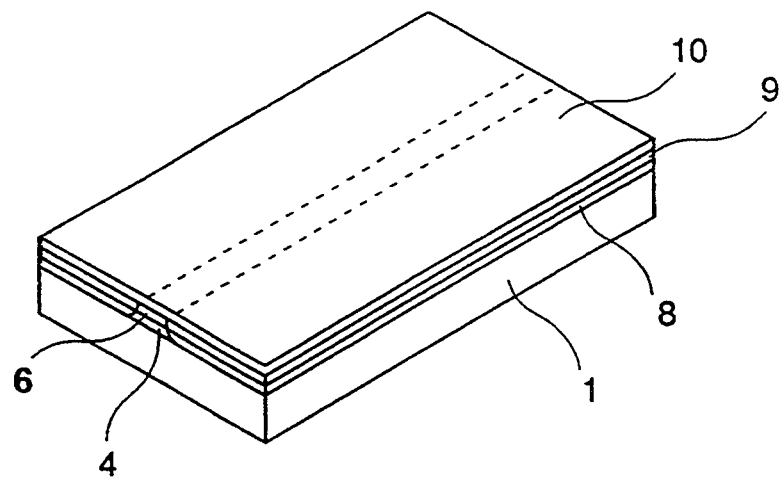
Figure 11I:
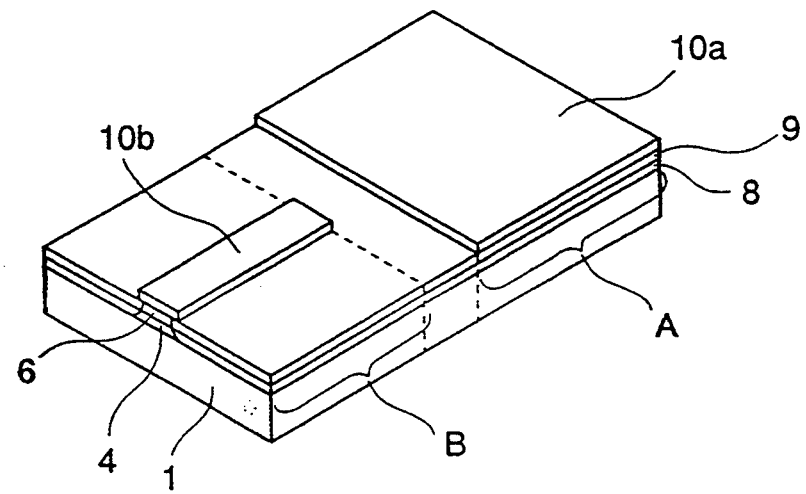
Figure 11J:
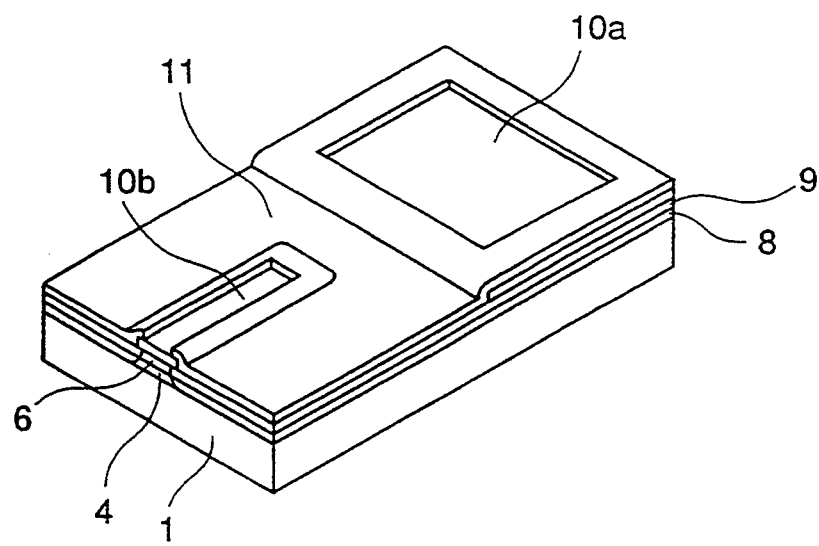
Figure 11K:
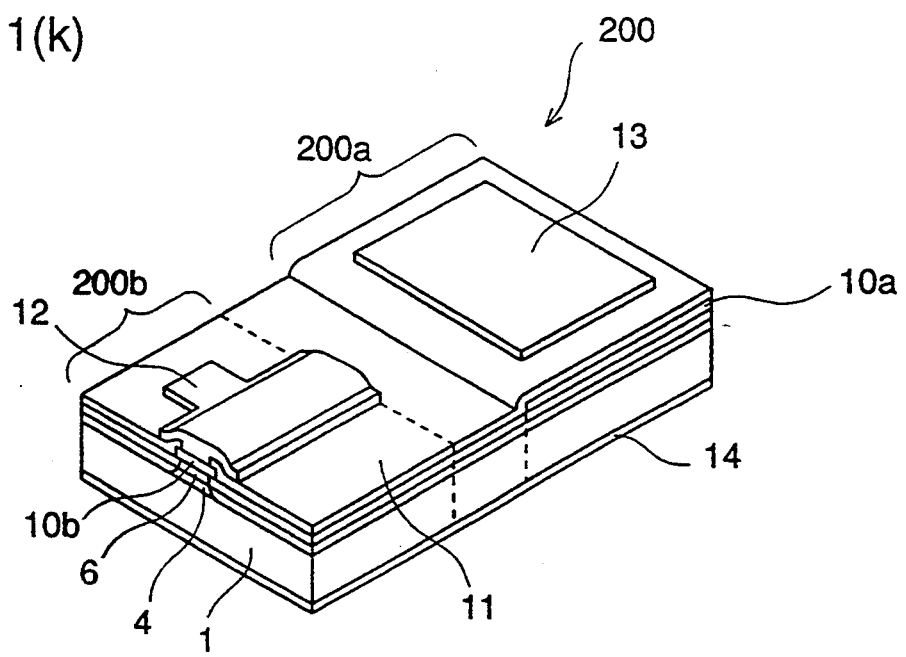
Figure 12A:
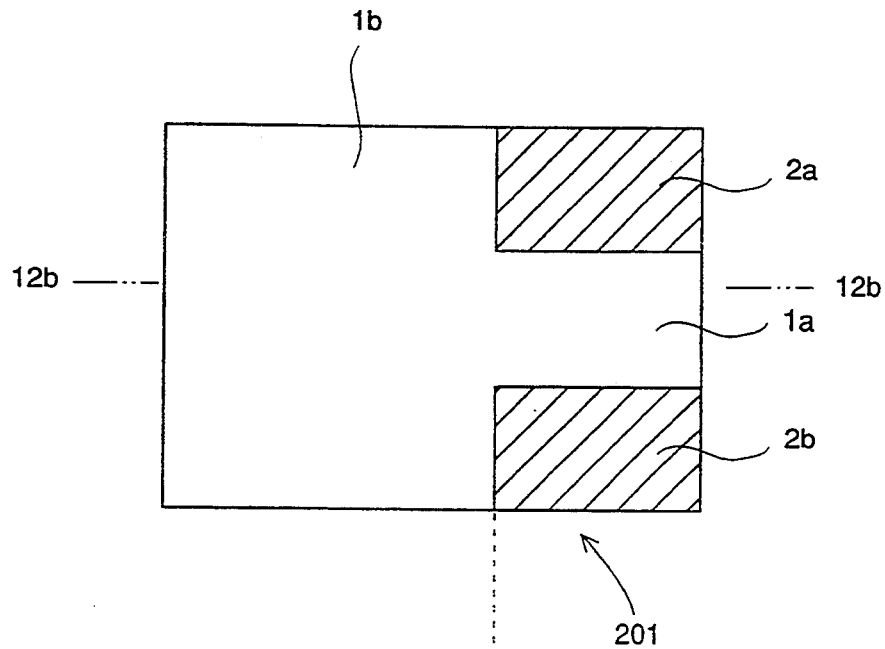
Figure 12B:
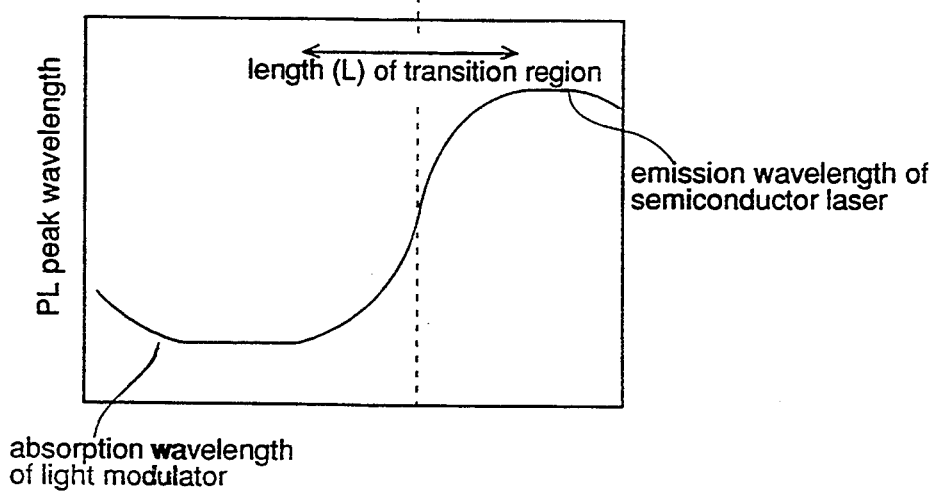
Figure 13:
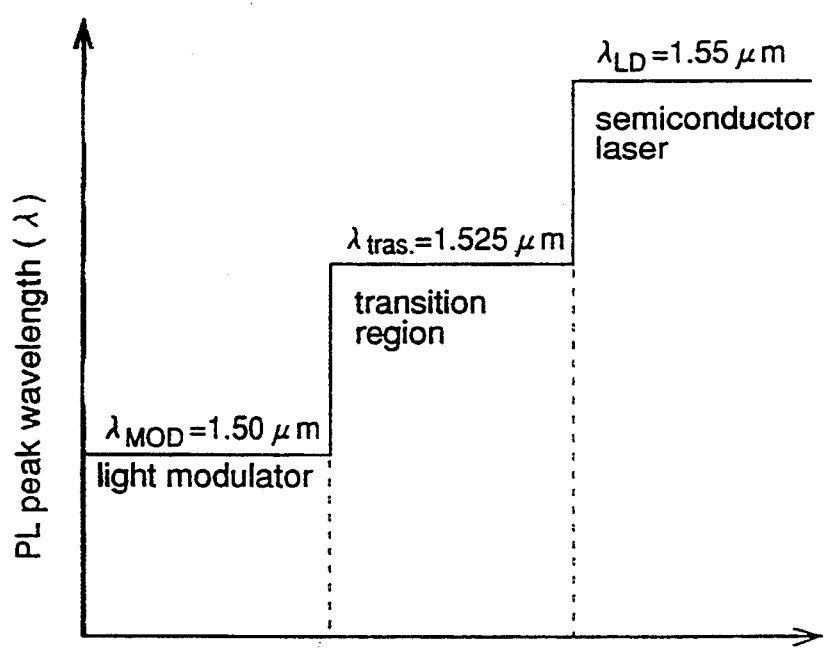
FIG. 13 is a graph showing variations in the PL peak wavelengths of an active layer of an integrated semiconductor light modulator and laser device fabricated according to the process steps of FIG. 11(a)-11(k) so that the absorption wavelength of the modulator is 1.50 $\mu$m and the emission wavelength of the semiconductor laser is 1.55 $\mu$m.
Figure 14A:
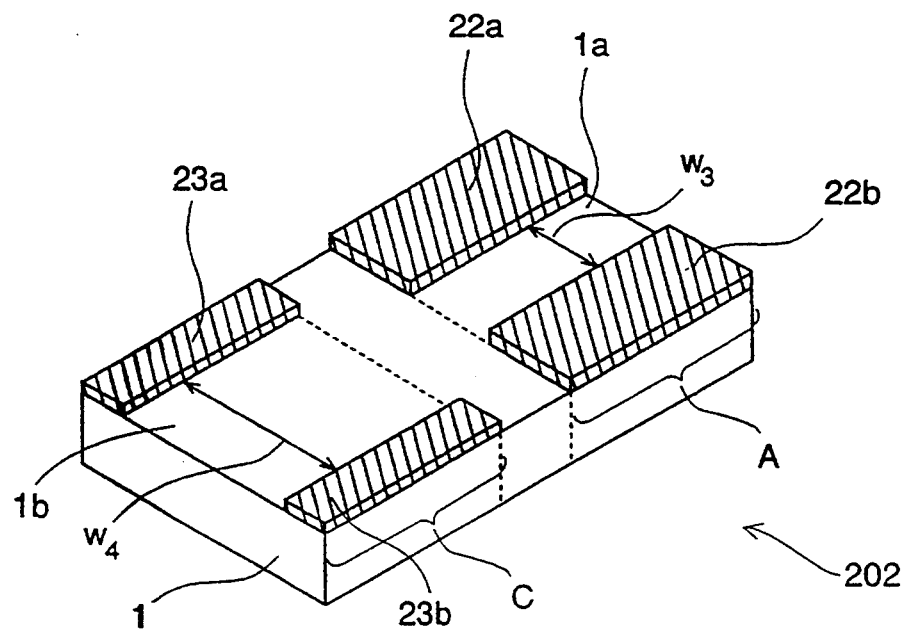
Figure 14B:
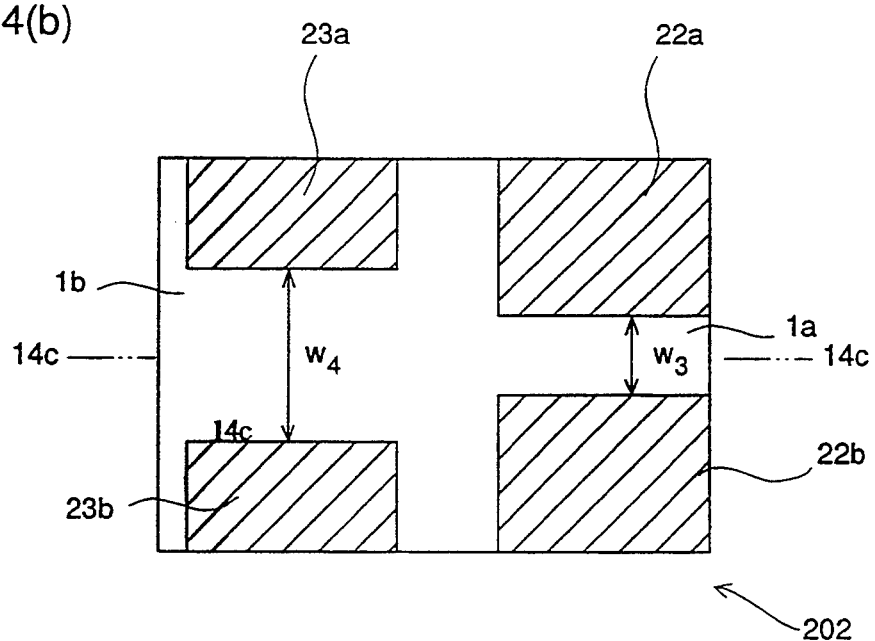
Figure 14C:
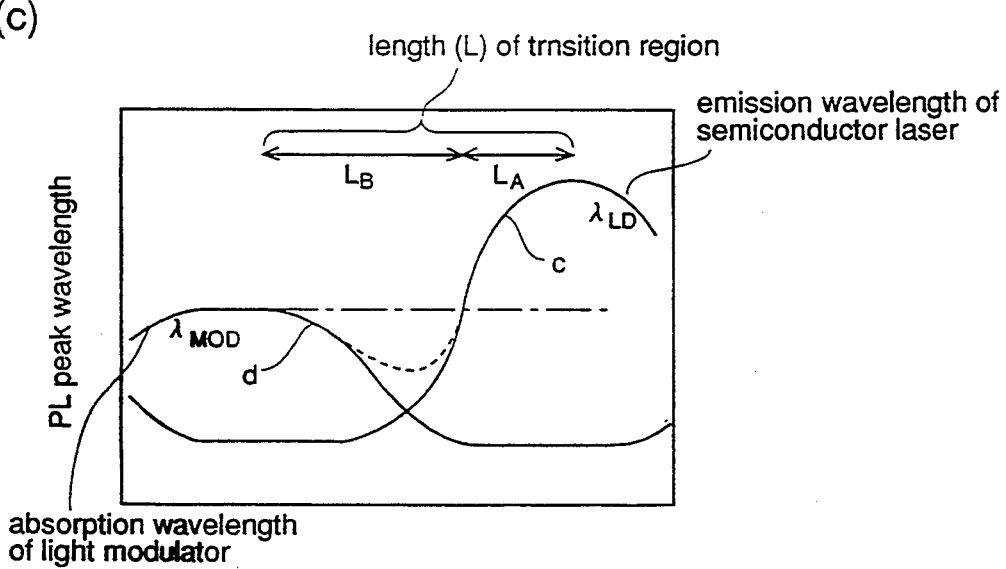
Figure 15A:
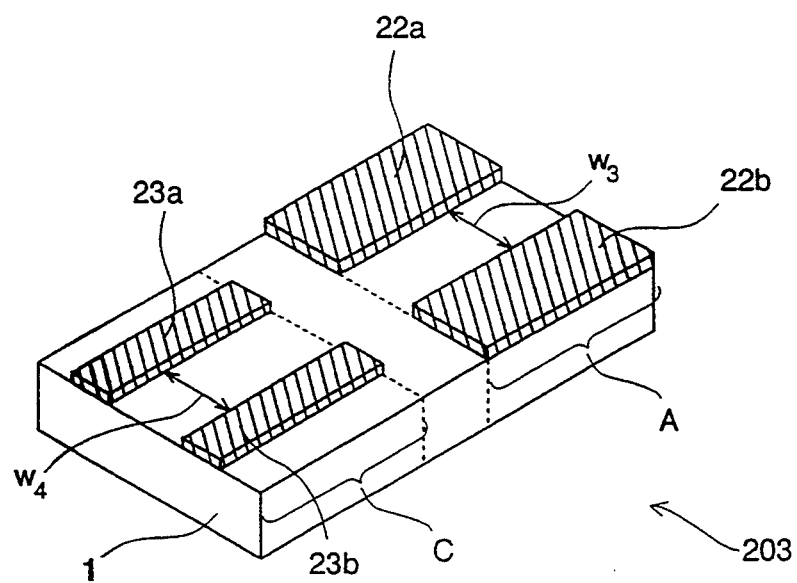
FIGS. 15(a) and 15(b) are perspective views illustrating modifications of the mask pattern shown in FIG. 14(a).
Figure 15B:
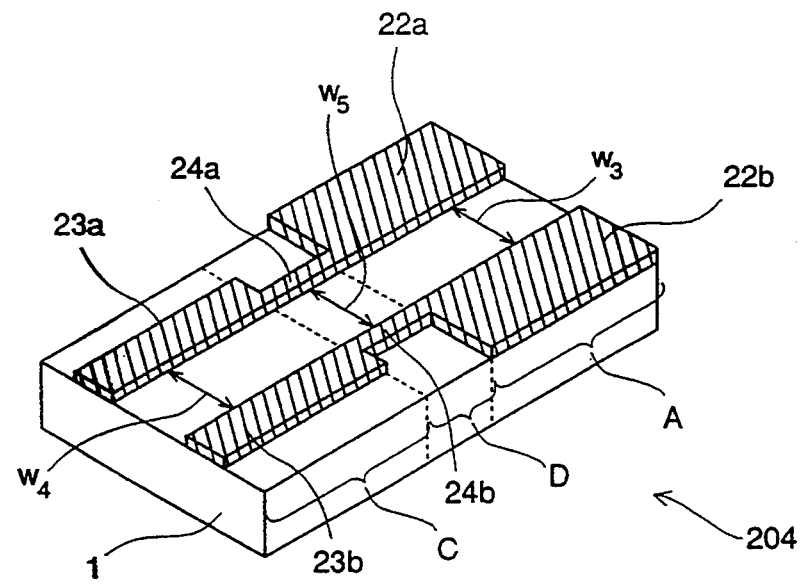

FIGS. 1(a) and 1(b) are diagrams for explaining a method of fabricating an integrated semiconductor light modulator and laser device in accordance with a first embodiment of the present invention. FIG. 1(a) is a plan view of a semiconductor wafer on which a mask pattern comprising a plurality of dielectric films 101a are disposed. FIG. 1(b) is a perspective view illustrating a chip region 101 included in the semiconductor wafer 100. In these figures, the same reference numerals as in FIGS. 10(a) and 11(a) designate the same or corresponding parts. Preferably, the dielectric masks 101a comprise SiO$_2$. In FIG. 1(a), the dielectric masks 101a are arranged on the wafer so that the portions 2a and 2b of the dielectric masks 101a on each chip region 101 are symmetrical with, i.e., in contact with, the portions 2b and 2a on an adjacent chip region 101 in a longitudinal direction of the chip regions i.e., along a direction parallel to longer edges of the portions 2a and 2b.

A description is given of the production process.

After deposition of a dielectric film over the surface of the semiconductor substrate 100, the dielectric film is patterned so that the portions 2a and 2b of the dielectric film remaining on the semiconductor laser region A of each chip region 101 are symmetrical with the portions 2b and 2a on adjacent chip region 101 in what becomes the resonator length direction (optical waveguide direction) of the semiconductor laser i.e., the longitudinal direction of the chip. The process steps after the patterning of the dielectric film are identical to those already described with respect to FIGS. 11(a)-11(k) and, therefore, do not require repeated description.

FIG. 2(a) is a plan view illustrating a part of the semiconductor wafer 100 shown in FIG. 1(a), and FIG. 2(b) is a graph showing variations in the thickness of the semiconductor layer 4 grown on the wafer in a section taken along line 2b—2b of FIG. 2(a), i.e., in the optical waveguide direction.

Figure 3A:
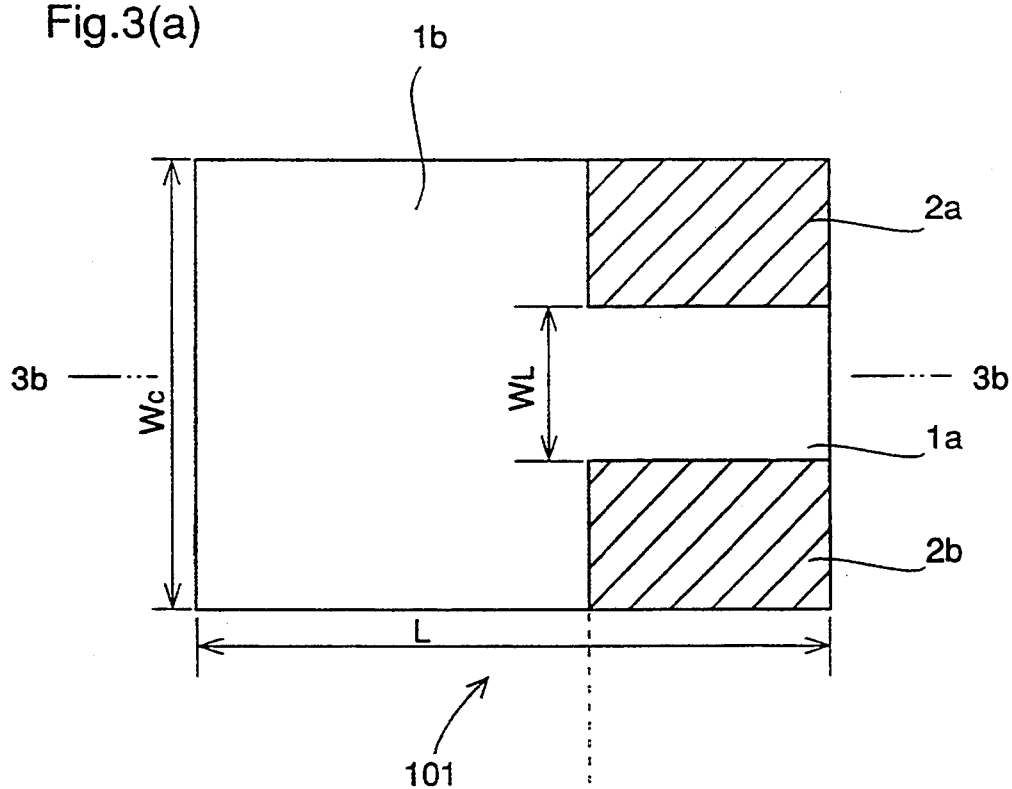
Figure 3B:
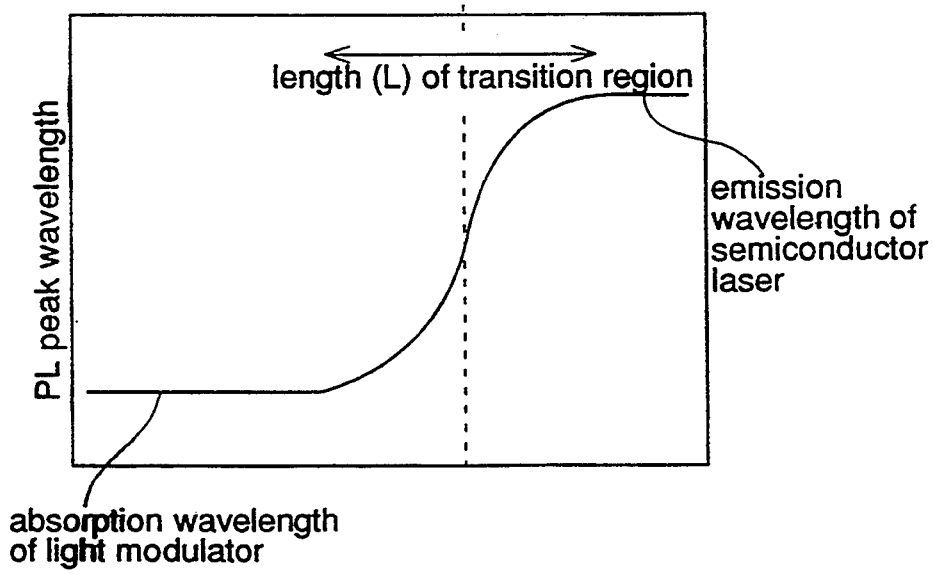

FIG. 3(a) is a plan view of the chip region 101 shown in FIG. 1(b), and FIG. 3(b) is a graph illustrating variations in the PL peak wavelength of a semiconductor layer grown on the chip region shown in FIG. 3(a) in a section taken along line 3b—3b of FIG. 3(a). In FIG. 3(a), the length L of the chip region 101 is 0.7~1 mm, the width W$_C$ of the chip region 101 is about 300 $\mu$m, and the width W$_L$ of the optical waveguide is about 100 $\mu$m.

As shown in FIG. 2(b), the semiconductor layer 4 is thicker in the region between the dielectric mask 2a and 2b than in the region where the dielectric mask is absent. However, since the dielectric masks 2a and 2b on each chip region are in contact with the dielectric masks on adjacent chip region in the optical waveguide direction, the profile of the thickness, i.e., the profile of the PL peak wavelength, of the semiconductor layer 4 in each chip region along the optical waveguide direction is flat at the edge of the semiconductor laser region 1a and at the edge of the light modulator region 1b, as shown in FIGS. 3(a) and 3(b).

As the result, the levels of the PL peak wavelenths at the light emitting edge of facet of the laser and at the light emitting facet of the light modulator do not vary, whereby the performance of the modulator integrated semiconductor laser chip is improved.

Figure 4A:
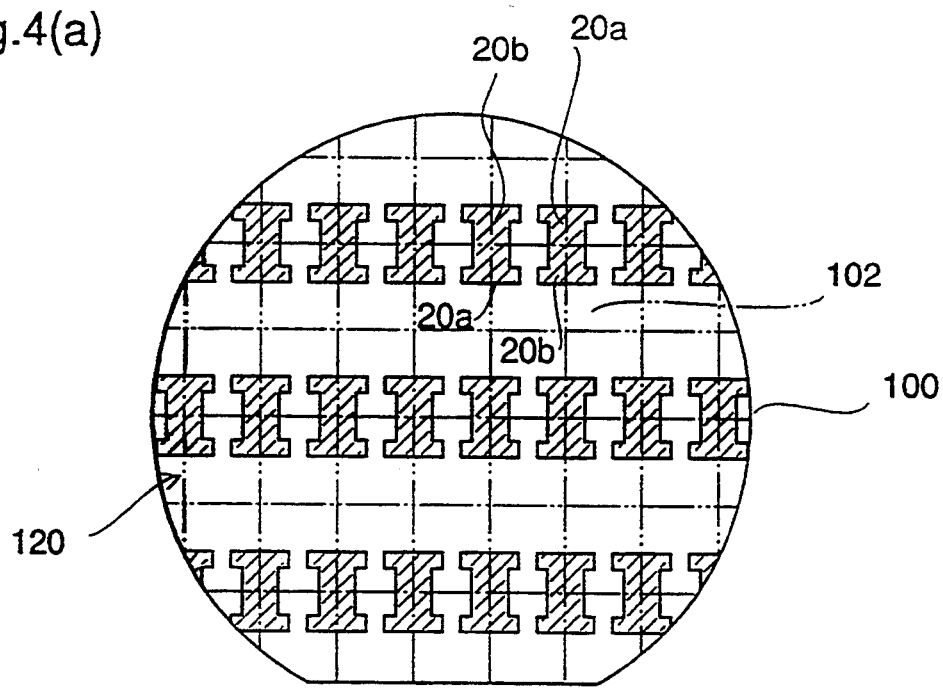
Figure 4B:
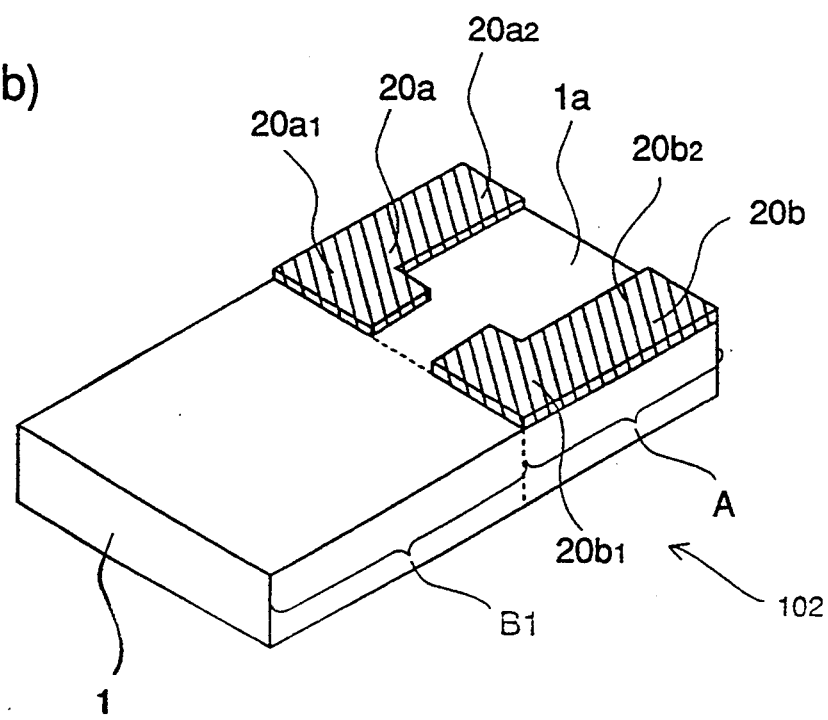

FIGS. 4(a) and 4(b) are diagrams for explaining a method of fabricating a modulator integrated semiconductor laser device in accordance with a second embodiment of the present invention. FIG. 4(a) is a plan view illustrating a mask pattern for selective growth formed on a semiconductor wafer, and FIG. 4(b) is a perspective view illustrating the mask pattern on each chip region of the semiconductor wafer. In these figures, the same reference numerals as in FIGS. 1(a) and 1(b) designate the same or corresponding parts. In FIG. 1(a), a mask pattern comprising a plurality of dielectric films 120, such as SiO$_2$films, is disposed on a semiconductor wafer 100 so that the portions 20a and 20b of the dielectric films 120 on each chip region 102 are symmetrical with, i.e., in contact with, the portions 20b and 20a on adjacent chip region in the longitudinal direction of the chip regions. The dielectric masks 20a and 20b on each chip region 102 are shaped like an L and an inverted L, respectively. That is, the dielectric mask 20a (20b) has a relatively wide portion 20a$_1$ (20b$_1$) adjacent to the light modulator region B1 and a portion 20a$_2$ (20b$_2$) narrower than the portion 20a$_1$ (20b$_1$).

The dielectric masks 20a and 20b are disposed on the semiconductor laser section A of the chip region 102 with an unmasked region 1a of the n type InP substrate 1 between them and with the relatively wide portions 20a$_1$ and 20b$_1$adjacent to the light modulator section B1. Therefore, the width of the unmasked region 1a between the dielectric masks 20a and 20b is narrower in a portion in the vicinity of the light modulator region B1 than in the other portion.

A description is given of the fabrication process.

After deposition of a dielectric film over the surface of the semiconductor substrate 100, the dielectric film is patterned so that the L-shaped portion 20a and the inverted L-shaped portion 20b of the dielectric film remaining on the laser region A of each chip region 101 are in contact with the portions 20b and 20a on adjacent chip region 102 in what becomes the resonator length direction of the semiconductor laser. The process steps after the patterning of the dielectric film are identical to those already described with respect to FIGS. 11(a)-11(k) and, therefore, do not require repeated description.

In the above-described fabrication process according to the second embodiment of the invention, the length L of the transition region between the semiconductor laser and the light modulator is reduced with no variation in the emission wavelength of the semiconductor laser. The reason will be described hereinafter.

Figure 5:
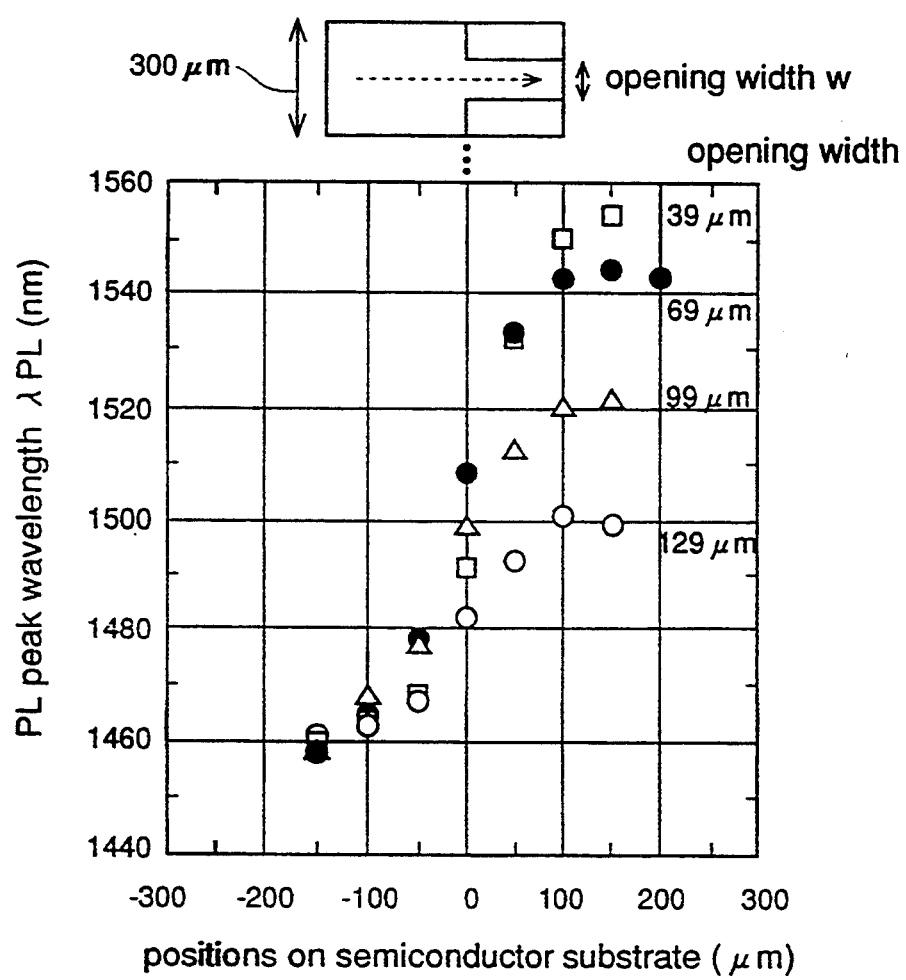
FIG. 5 is a graph showing variations in the PL peak wavelengths of InGaAsP/InGaAs MQW layers grown by MOCVD on InP substrates using mask patterns having different opening widths.

FIG. 5 is a graph illustrating variations in the crystal compositions, i.e., variations in the PL peak wavelengths, of a plurality of InGaAsP/InGaAs MQW well layers which are grown on InP substrates with different dielectric masks having different opening widths. The MQW layers are grown by MOCVD. In FIG. 5, the abscissa shows distance from an edge of the dielectric mask in the middle of the chip region, and the direction toward the opposite edge of the dielectric mask is the positive direction.

The PL peak wavelengths are measured with a microscopic photoluminescence measuring apparatus that evaluates optical characteristics in a microscopic area.

As shown in FIG. 5, as the opening width w of the dielectric mask decreases, the PL peak wavelength of the semiconductor layer grown in the opening of the dielectric mask shifts toward the longer wavelength side, and the crystal composition in the transition region changes more steeply. Further, the crystal composition of the semiconductor layer grown in the opening of the dielectric mask is stable at a distance of about 100 μm from the edge of the dielectric mask in the middle of the chip region.

In this second embodiment of the invention, as shown in FIG. 4(b), the dielectric mask pattern on the chip region 102 comprises the L-shaped portion 20a and the inverted L-shaped portion 20b, so that the width of the opening 1a of the mask pattern is reduced in the vicinity of the boundary between the laser region A and the modulator region B1. When a semiconductor layer is grown on the chip region with the mask pattern, the quantity of the group-III elements applied to the boundary between the laser region A and the modulator region B1 is increased, whereby a steep change of the crystal composition is obtained at the boundary. The crystal composition of a portion of the grown semiconductor layer to be a substantial laser oscillation region providing the emission wavelength of the laser is controlled by the relatively narrow portions $20a_2$ and $20b_2$ of the mask pattern.

Figure 6A:
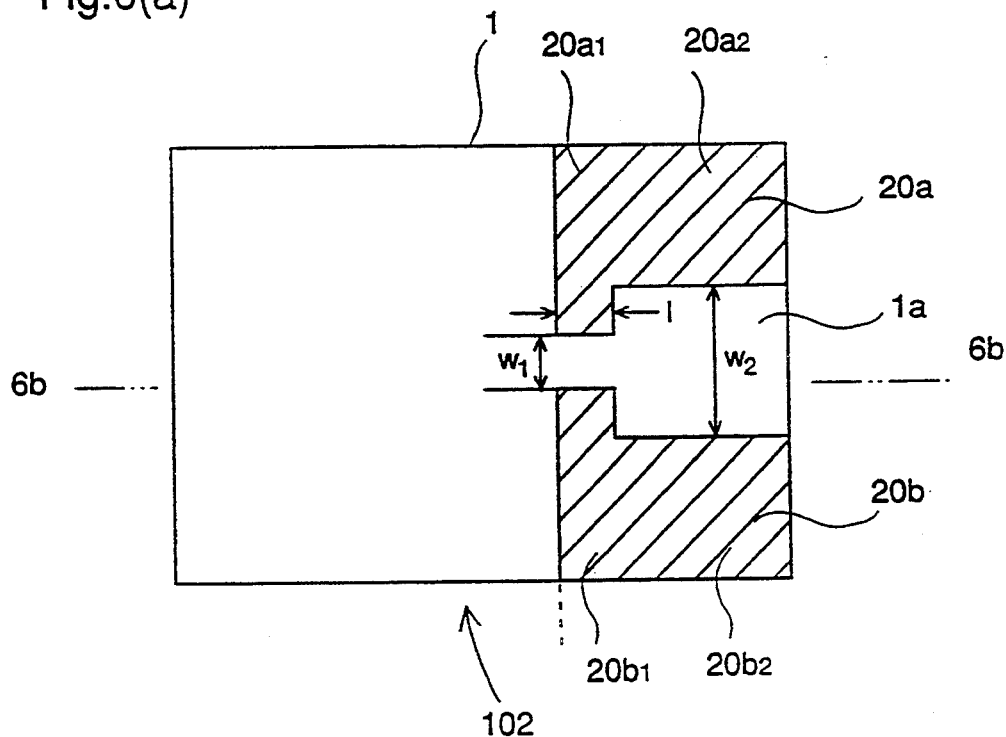
Figure 6B:
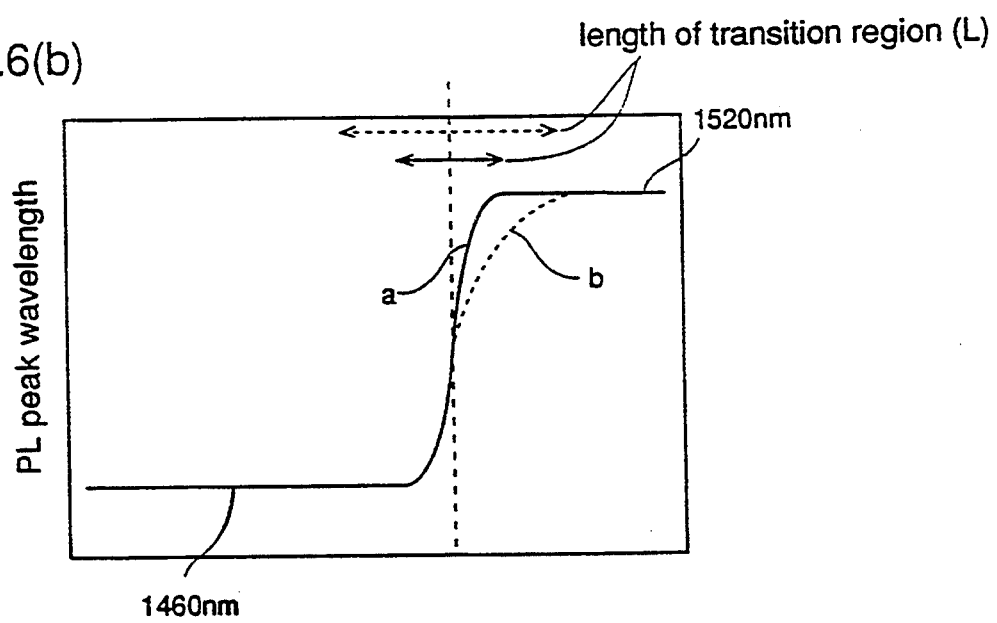

FIG. 6(a) is a plan view of the chip region 102 shown in FIG. 4(b). In FIG. 6(a), the length 1 of the relatively wide portion $20a_1$ ($20b_1$) of the dielectric mask $20a$ ($20b$) is about 50 μm. The width $w_1$ of the opening between the portions $20a_1$ and $20b_1$ is about 20 μm. The width $w_2$ of the opening between the relatively narrow portions $20a_2$ and $20b_2$ of the dielectric masks $20a$ and $20b$ is about 100 μm. FIG. 6(b) is a graph showing variations in the PL peak wavelength (continuous line "a") of an InGaAsP/InGaAs MQW layer grown on the chip region with the dielectric mask pattern shown in FIG. 6(a) by MOCVD.

The reason why the width $w_2$ is about 100 μm is described.

In an integrated semiconductor light modulator and laser as described above, usually, the difference between the emission wavelength of the semiconductor laser and the absorption wavelength of the light modulator is about 60 nm. In FIG. 5, the difference of about 60 nm is attained when the InGaAsP/InGaAs MQW layer is grown using a dielectric mask whose opening width is 99 μm. In addition, the dotted line "b" in FIG. 6(b) shows variations in the PL peak wavelength when the opening width of the dielectric mask pattern is 99 μm.

As shown in FIGS. 6(a) and 6(b), when the width of the dielectric mask pattern is partially increased in a region near the boundary between the laser region and the modulator region, the quantity of the group-III elements applied to the boundary region increases with little change of the crystal composition, i.e., PL peak wavelength, of the semiconductor layer in the laser region, and the crystal composition of the semiconductor layer in the boundary region changes steeply. As the result, the length of the transition region is reduced compared to the prior art an integrated semiconductor light modulator and laser.

As described above, according to the second embodiment of the present invention, a pair of dielectric masks 20a and 20b are produced on the semiconductor laser region A of the substrate 1 with the unmasked portion 1a of the substrate 1 between them. The width of the portion $20a_1$ ($20b_1$) of the dielectric mask $20a$ ($20b$) in the vicinity of the modulator region B1 is larger than the width of the portion $20a_2$($20b_2$) of the dielectric mask. Thereafter, the active layer 4 including at least an MQW layer having a portion as an active layer of the semiconductor laser and a portion as a light absorption layer of the modulator is grown on the substrate with the mask pattern. Therefore, the crystal composition of the active layer 4 steeply changes in a region where the semiconductor laser and the modulator are optically connected, whereby the length of the transition region is reduced. As the result, an integrated semiconductor light modulator and laser device that reduces the attenuation of the light intensity in the transition region and produces optical signals with stable intensity is produced.

In the above-described second embodiment of the invention, the width of the dielectric mask pattern and the width of the opening of the dielectric mask pattern vary according to a desired difference in the PL peak wavelengths between the laser and the modulator and the semiconductor material employed.

Figure 7A:
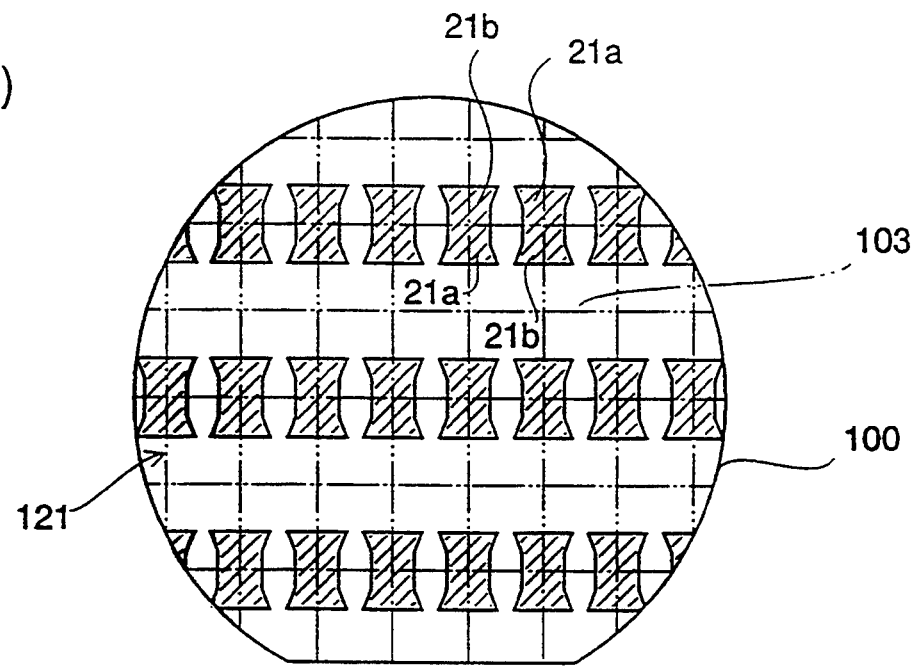
Figure 7B:
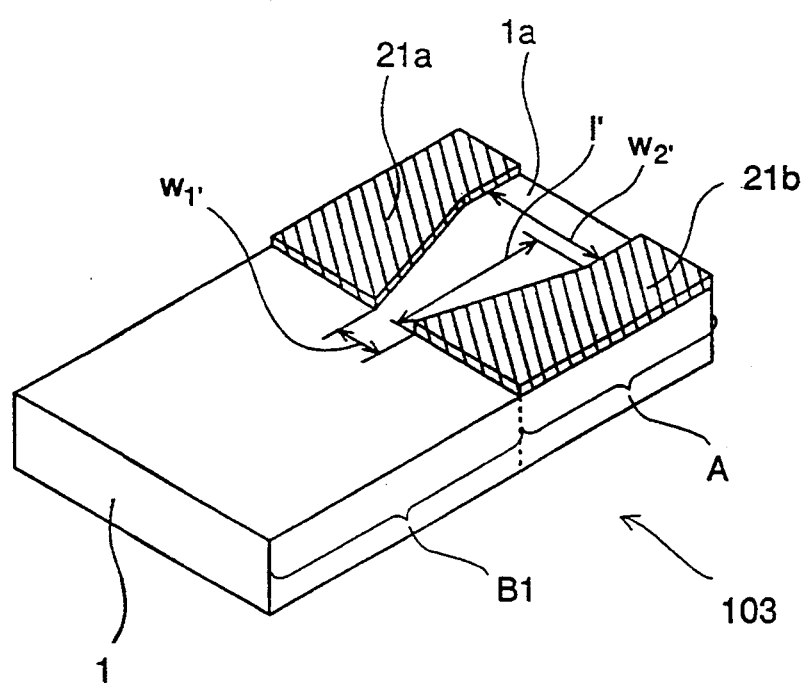

FIGS. 7(a) and 7(b) are diagrams for explaining a method of fabricating an integrated semiconductor light modulator and laser device in accordance with a third embodiment of the present invention. FIG. 7(a) is a plan view of a semiconductor wafer 100 on which a mask pattern comprising a plurality of dielectric films 121 is disposed. FIG. 7(b) is a perspective view illustrating a chip region 103 of the semiconductor wafer 100. In these figures, the same reference numerals as in FIGS. 4(a) and 4(b) designate the same or corresponding parts. In FIG. 7(a), a plurality of dielectric masks 121 comprising $SiO_2$ or the like are arranged on the semiconductor wafer 100 so that portions 21a and 21b of the dielectric masks on each chip region 103 are symmetrical with, i,e., in contact with, the portions 21b and 21a on an adjacent chip region in the longitudinal direction of the chip regions, i.e., in what becomes the resonator length direction of the semiconductor laser. As shown in FIG. 7(b), the dielectric masks 21a and 21b are disposed on the semiconductor laser region A of the chip region 103, and each of the dielectric masks 21a and 21b has a portion whose width is gradually increasing toward the light modulator region B1.

A description is given of the production method.

After deposition of a dielectric film over the surface of the semiconductor wafer 100, the dielectric film is patterned so that the portions 21a and 21b of the dielectric film remaining on the semiconductor laser region A of each chip region 103 are symmetrical with, i.e., in contact with, the portions 21b and 21a on adjacent chip region 103 in what becomes the resonator length direction of the semiconductor laser. The process steps after the patterning of the dielectric film are identical to those already described with respect to FIGS. 11(a)-11(k) and, therefore, do not require repeated description.

The width of the dielectric mask 21a (21b) and the width of the unmasked portion 1a of the substrate 1 between the dielectric masks 21a and 21b are selected as follows. For example, when an integrated semiconductor light modulator and laser device in which the difference between the emission wavelength of the laser and the absorption wavelength of the modulator is 60 nm is fabricated using an InGaAsP/InGaAs multiquantum well layer, the width $w_1'$ of the opening 1a between the dielectric masks 21a and 21b at an edge of the laser region A adjacent to the light modulator region B1 is slightly smaller than the width $w_1$ shown in FIG. 6(a) according to the second embodiment of the invention. In addition, the width $w_2'$ of the opening 1a at the opposite edge of the laser region A is equal to the width $w_2$ shown in FIG. 6(a). Further, the length $l'$ of the tapered portion of the opening 1a is about 1.5 times longer than the length l of FIG. 6(a).

Also in this fabrication method, the quantity of the group-III elements migrating from the dielectric masks 21a and 21b to the unmasked portion 1a of the substrate between the dielectric masks increases at the boundary between the laser region A and the modulator region B1, whereby a steep change in the crystal composition (PL peak wavelength) of the grown semiconductor layer is achieved at the boundary. As the result, the length L of the transition region is reduced compared to the prior art device, resulting in an integrated semiconductor light modulator and laser device with reduced attenuation of the light intensity in the transition region and that produces optical signals with stable intensity.

Figure 8A:
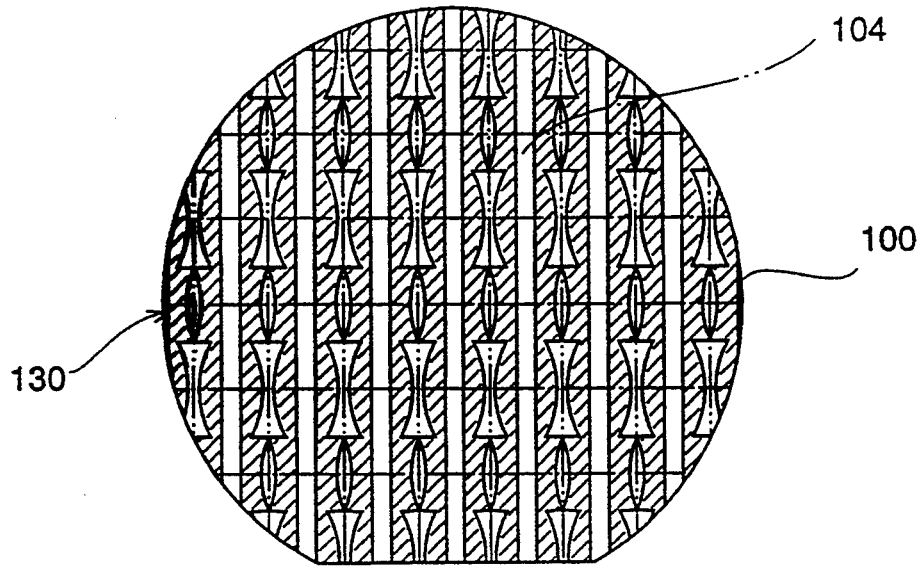
Figure 8B:
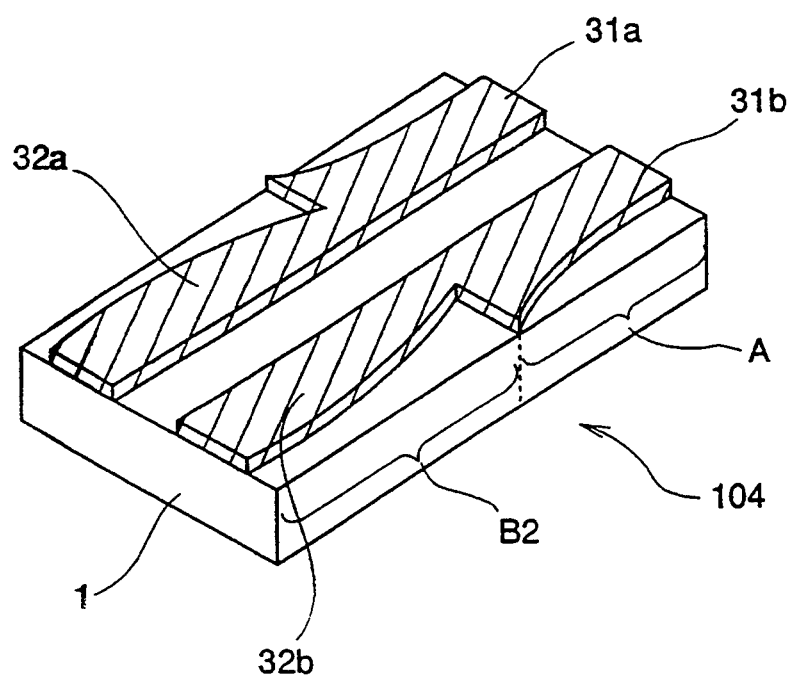
Figure 9A:
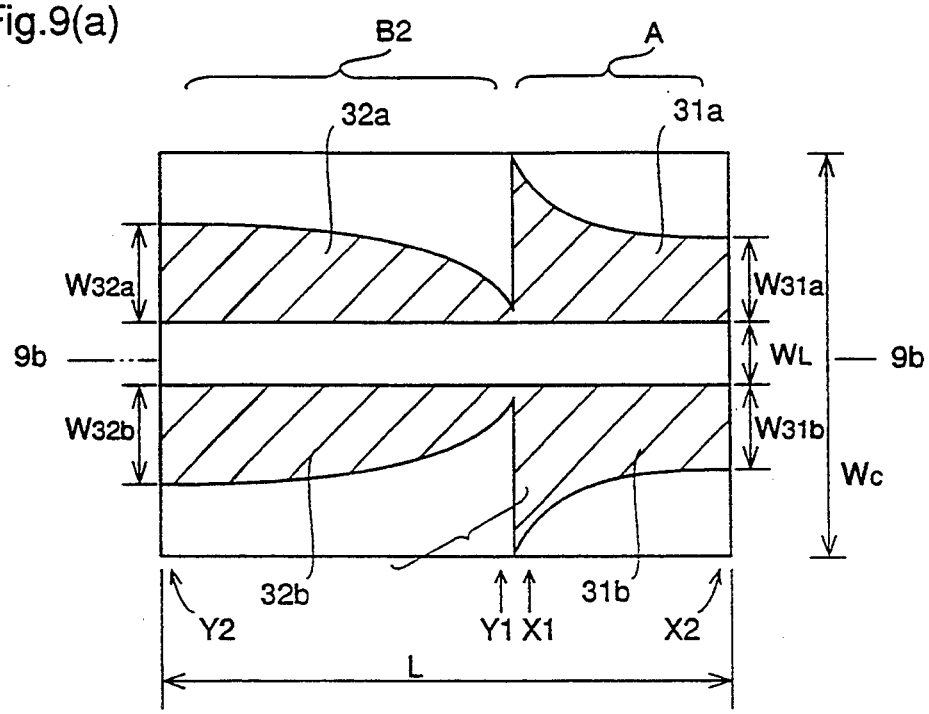
Figure 9B:
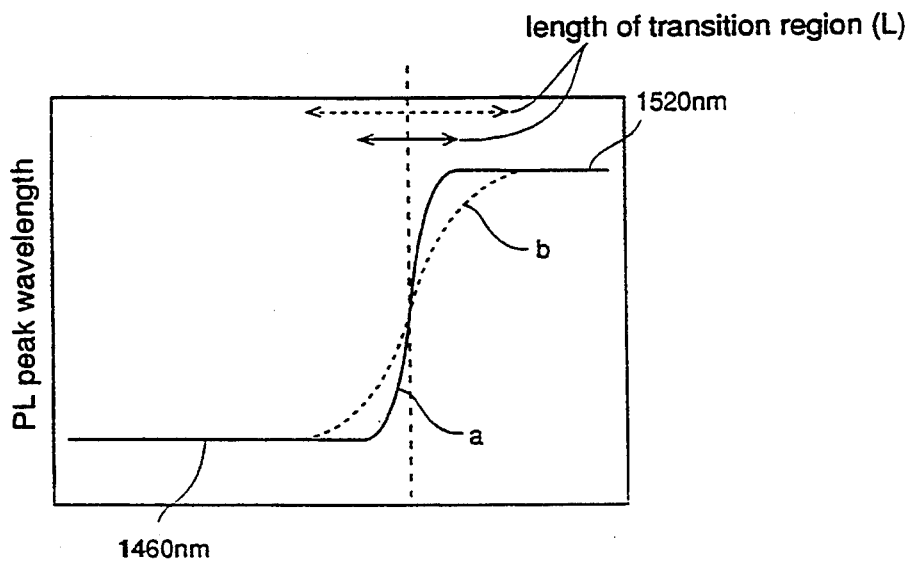

FIGS. 8(a)-8(b) and 9(a)-9(b) are diagrams for explaining a method of fabricating an integrated semiconductor light modulator and laser device in accordance with a fourth embodiment of the present invention. FIG. 8(a) is a plan view of a semiconductor wafer 100 on which a mask pattern comprising a plurality of dielectric films 130 are produced. FIG. 8(b) is a perspective view illustrating a chip region 104 of the semiconductor wafer 100. FIG. 9(a) is a plan view of the chip region 104 shown in FIG. 8(b). FIG. 9(b) is a graph illustrating variations in PL peak wavelength of a semiconductor layer grown on the chip region 104 at a section taken along line 9b—9b of FIG. 9(a). In these figures, the same reference numerals as in FIGS. 4(a) and 4(b) designate the same or corresponding parts. In FIG. 8(a), a plurality of dielectric masks 130 comprising $SiO_2$ or the like are arranged on the semiconductor wafer 100 so that portions 31a, 31b, 32a, and 32b of the dielectric masks 130 on each chip region 103 are symmetrical with these portions on an adjacent chip region in the longitudinal direction of the chip regions, i.e., in what becomes the resonator length direction of the semiconductor laser.

More specifically, as shown in FIG. 9(a), the mask pattern on the chip region comprises a pair of concave dielectric masks 31a and 31b disposed on the laser region A and a pair of convex dielectric masks 32a and 32b disposed on the modulator region B2. The width of the dielectric mask 31a (31b) on the laser region A gradually increases toward the modulator region B2, and the width of the dielectric mask 32a (32b) on the modulator region B2 gradually decreases toward the laser region A.

The smallest width $W_{31a}$ ($W_{31b}$) of the dielectric mask 31a (31b) is larger than the largest width $W_{32a}$ ($W_{32b}$) of the dielectric film 32a (32b). The opening ratio of the dielectric mask pattern at the edge of the laser region A (position $X_2$), i.e., the ratio of the opening width to the width $W_C$ of the chip region ($W_C - W_{31a} - W_{31b}$), is about 50%, and that at the opposite edge of the laser region A in the middle of the chip region (position $X_1$) is about 20%. The opening ratio of the dielectric mask pattern at the edge of the modulator region B2 (position $Y_2$), i.e., the ratio of the opening width to the width $W_C$ of the chip region ($W_C - W_{32a} - W_{32b}$), is about 40%, and that at the opposite edge of the modulator region B2 in the middle of the chip region (position $Y_2$) is about 90%.

In addition, the length L of the chip region is 0.7~1 mm, the width $W_C$ of the chip region is about 300 μm, and the width $W_L$ of the optical waveguide is about 100 μm.

A description is given of the production process.

After deposition of a dielectric film over the surface of the semiconductor wafer 100, the dielectric film is patterned as shown in FIG. 8(a) so that the portions 31a, 31b, 32a, and 32b remain on each chip region 104 as shown in FIG. 8(b). The dielectric mask pattern on each chip region 104 is symmetrical with the dielectric mask pattern on an adjacent chip region in what becomes the resonator length direction of the semiconductor laser. The process steps after the patterning of the dielectric film are identical to those already described with respect to FIGS. 11(a)-11(k) and, therefore, do not require repeated description.

In this fourth embodiment of the invention, when a semiconductor layer having a portion for a semiconductor laser and a portion for a light modulator, which portions have different crystal compositions, is formed on each chip region of the semiconductor wafer, the dielectric mask pattern shown in FIG. 8(b) is employed. In the mask pattern, the width of the dielectric mask 31a (31b) on the laser region A gradually, i.e., parabolically, increases toward the modulator region B2 and becomes maximum at the boundary between the laser region A and the modulator region B2, and the width of the dielectric mask 32a (32b) on the modulator region B2 gradually, i.e., parabolically, decreases toward the laser region A and becomes minimum at the boundary between the laser region A and the modulator region B2. Therefore, when the semiconductor layer is grown, since the opening ratio of the dielectric mask is reduced at a part of the laser region A in the vicinity of the modulator region B2 compared to the other part, the quantity of growth elements migrating from the dielectric mask to that part increases. On the other hand, since the opening ratio of the dielectric mask is increased at a part of the modulator region B2 in the vicinity of the laser region A, the quantity of the growth elements migrating from the dielectric mask to that part decreases.

Therefore, a reduction in the quantity of the growth elements is suppressed in the part of the laser region A near the modulator region B2 while an increase in the quantity of the growth elements is suppressed in the part of the modulator region B2 near the laser region A. Therefore, a steep change of crystal composition is achieved at the boundary between the laser region A and the modulator region B2 (FIG. 9(b)), whereby the transition region between these regions is significantly reduced.

What is claimed is:

1. A method of fabricating an integrated semiconductor light modulator and laser device comprising:
   preparing a semiconductor wafer having a plurality of chip regions;
   forming a semiconductor layer having first and second semiconductor regions of different compositions on each chip region of the semiconductor wafer by selective crystal growth using a film having a prescribed pattern as a mask, said mask on each chip region having a pair of dielectric films and an opening, the dielectric films and opening on one chip region being arranged symmetrically with respect to the dielectric films and opening on an adjacent chip region relative to a central axis between the dielectric films along what becomes the optical waveguide direction of the semiconductor laser; and
   forming a semiconductor laser in a first area of the semiconductor layer in each chip region and a light modulator, for modulating laser light emitted from the semiconductor laser, in a second area of the semiconductor layer in each chip region.

2. The method of claim 1 wherein said semiconductor layer includes at least a multiquantum well layer having a first portion as an active layer of the semiconductor laser and a second portion as a light absorption layer of the light modulator.

3. The method of claim 1 wherein said semiconductor Layer is a III–V compound and including growing said semiconductor layer by MOCVD.

4. A method of fabricating an integrated semiconductor light modulator and laser device comprising:
   preparing a semiconductor wafer having a plurality of chip regions;
   forming a semiconductor layer having first and second semiconductor regions of different compositions on each chip region of the semiconductor wafer by selective crystal growth using a film having a prescribed pattern as a mask, said mask comprising a pair of dielectric films facing each other on a portion of the chip region where a semiconductor laser is to be fabricated along a central axis that becomes the optical waveguide direction of the semiconductor laser, the width of each dielectric film being larger in the vicinity of an area where a light modulator is to be fabricated than far from the area where a light modulator is to be fabricated; and
   forming a semiconductor laser in a first area of the semiconductor layer in each chip region and a light modulator, for modulating laser light emitted from the semiconductor laser, in a second area of the semiconductor layer in each chip region.

5. The method of claim 4 wherein said semiconductor layer includes at least a multiquantum well layer having a first portion as an active layer of the semiconductor laser and a second portion as a light absorption layer of the light modulator.

6. The method of claim 4 wherein said semiconductor layer is a III–V compound and including growing said semiconductor layer by MOCVD.

7. The method of claim 4 wherein said pair of dielectric films comprise an L-shaped dielectric film and an inverted L-shaped dielectric film.

8. The method of claim 4 wherein each dielectric film has a portion having a width gradually increasing toward the second area in the vicinity of the light modulator.

9. A method of fabricating an integrated semiconductor light modulator and laser device comprising:
   preparing a semiconductor wafer having a plurality of chip regions;
   forming a semiconductor layer having first and second semiconductor regions of different compositions on each chip region of the semiconductor wafer by selective crystal growth using a film having a prescribed pattern as a mask, said mask comprising a pair of dielectric films opposed to each other with a space between them on each chip region along a central axis that becomes the optical waveguide direction of the laser and the modulator, wherein each dielectric film has a width in an area where the semiconductor laser is to be fabricated gradually increasing toward an area where the light modulator is to be fabricated, the width of each dielectric film in the area where the light modulator is to be fabricated gradually decreasing toward the area where the semiconductor laser is to be fabricated, the width becoming smallest in the vicinity of the boundary between the area where the semiconductor laser is to be fabricated and the area where the modulator is to be fabricated; and
   forming a semiconductor laser in a first area of the semiconductor layer in each chip region and a light modulator, for modulating laser light emitted from the semiconductor laser, in a second area of the semiconductor layer in each chip region.

10. The method of claim 9 wherein said semiconductor layer includes at least a multiquantum well layer having a first portion as an active layer of the semiconductor laser and a second portion as a light absorption layer of the light modulator.

11. The method of claim 9 wherein said semiconductor layer is a III–V compound and including growing said semiconductor layer by MOCVD.

12. The method of claim 9 wherein each of said dielectric films has a receding portion in the first area and has a width gradually increasing toward the second area and an extending portion in the second area having a width gradually decreasing toward the semiconductor laser region.

* * * * *